United States Patent
Lee et al.

(10) Patent No.: US 12,490,491 B2
(45) Date of Patent: Dec. 2, 2025

(54) INTEGRATED CIRCUIT DEVICES INCLUDING A BACK SIDE POWER DISTRIBUTION NETWORK STRUCTURE AND METHODS OF FORMING THE SAME

(71) Applicant: Samsung Electronics Co., Ltd., Suwon-si (KR)

(72) Inventors: Jongjin Lee, Clifton Park, NY (US); Tae Sun Kim, Ballston Spa, NY (US); Wonhyuk Hong, Clifton Park, NY (US); Seungchan Yun, Waterford, NY (US); Kang-ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 420 days.

(21) Appl. No.: 18/160,341

(22) Filed: Jan. 27, 2023

(65) Prior Publication Data
US 2024/0096984 A1   Mar. 21, 2024

Related U.S. Application Data

(60) Provisional application No. 63/376,588, filed on Sep. 21, 2022.

(51) Int. Cl.
| | |
|---|---|
| *H10D 64/00* | (2025.01) |
| *H01L 23/528* | (2006.01) |
| *H10D 30/43* | (2025.01) |
| *H10D 30/67* | (2025.01) |
| *H10D 62/10* | (2025.01) |
| *H10D 64/01* | (2025.01) |
| *H10D 64/23* | (2025.01) |

(52) U.S. Cl.
CPC ....... *H10D 64/256* (2025.01); *H01L 23/5286* (2013.01); *H10D 30/43* (2025.01);
(Continued)

(58) Field of Classification Search
CPC .. H10D 64/256; H10D 30/43; H10D 30/6735; H10D 62/121; H10D 64/01;
(Continued)

(56) References Cited

U.S. PATENT DOCUMENTS

| | | |
|---|---|---|
| 11,222,892 B2 | 1/2022 | Su et al. |
| 11,450,665 B2 | 9/2022 | Chiang et al. |
| (Continued) | | |

FOREIGN PATENT DOCUMENTS

| | | |
|---|---|---|
| TW | 202201639 A | 1/2022 |
| TW | 202201697 A | 1/2022 |
| TW | 202209568 A | 3/2022 |

OTHER PUBLICATIONS

"Extended European Search Report dated Apr. 2, 2024, issued in corresponding European Application No. 23197058.3 pp. 16".

*Primary Examiner* — Sheikh Maruf
(74) *Attorney, Agent, or Firm* — Myers Bigel, P.A.

(57) ABSTRACT

Integrated circuit devices and methods of forming the same are provided. The methods may include providing a substrate structure including a substrate, a bottom insulator and a semiconductor region between the substrate and the bottom insulator, the semiconductor region extending in a first direction; forming first and second preliminary transistor structures on the bottom insulator, wherein and the bottom insulator may include first and second portions that the first and second preliminary transistor structures respectively overlap, and a third portion between the first and second portions; replacing the third portion of the bottom insulator with a bottom semiconductor layer; forming a source/drain region between the first and second preliminary transistor structures; replacing the substrate and the semiconductor region with a backside insulator; forming a power contact in the backside insulator, wherein the source/drain region may overlap the power contact; and forming a power rail.

15 Claims, 24 Drawing Sheets

(52) U.S. Cl.
CPC ....... *H10D 30/6735* (2025.01); *H10D 62/121* (2025.01); *H10D 64/01* (2025.01)

(58) Field of Classification Search
CPC ............. H10D 30/014; H10D 30/0198; H10D 30/6757; H10D 62/364; H10D 64/251; H10D 84/0149; H10D 84/0186; H10D 84/038; H10D 84/83; H10D 84/85; H10D 88/00; H10D 88/01; H10D 84/834; H10D 64/254; H01L 23/5286; H01L 21/76897; H01L 23/5226; H01L 23/5283; B82Y 10/00
USPC ........................................................ 438/284
See application file for complete search history.

(56) References Cited

U.S. PATENT DOCUMENTS

| | | | |
|---|---|---|---|
| 11,482,594 | B2 | 10/2022 | Yu et al. |
| 2010/0102363 | A1* | 4/2010 | Hause .................. H10D 64/258 257/E21.409 |
| 2015/0048429 | A1* | 2/2015 | He .......................... H10D 30/62 257/288 |
| 2017/0092735 | A1* | 3/2017 | Hashemi ............... H10D 64/021 |
| 2018/0151441 | A1* | 5/2018 | Lin ....................... H01L 21/3088 |
| 2019/0245083 | A1* | 8/2019 | Reznicek ............... H10D 30/63 |
| 2020/0127110 | A1* | 4/2020 | Lee ....................... H10D 64/254 |
| 2020/0135920 | A1* | 4/2020 | Kong ................... H10D 30/025 |
| 2020/0303509 | A1* | 9/2020 | Mehandru ............. H10D 30/62 |
| 2021/0043502 | A1* | 2/2021 | Wu ....................... H10D 84/038 |
| 2021/0336004 | A1* | 10/2021 | Huang ............... H10D 30/6757 |
| 2021/0343578 | A1 | 11/2021 | Chang et al. |
| 2021/0391325 | A1 | 12/2021 | Su et al. |
| 2021/0399099 | A1 | 12/2021 | Chu et al. |
| 2022/0037193 | A1 | 2/2022 | Yu et al. |
| 2022/0102274 | A1 | 3/2022 | Chien et al. |
| 2022/0139911 | A1 | 5/2022 | Wei et al. |
| 2022/0148964 | A1* | 5/2022 | Chen .................. H01L 21/76897 |
| 2022/0271138 | A1* | 8/2022 | Su ....................... H10D 30/6735 |
| 2022/0293759 | A1 | 9/2022 | Chou et al. |
| 2022/0310455 | A1* | 9/2022 | Huang ............... H10D 30/6757 |

* cited by examiner

INTEGRATED CIRCUIT DEVICES INCLUDING A BACK SIDE POWER DISTRIBUTION NETWORK STRUCTURE AND METHODS OF FORMING THE SAME

CROSS-REFERENCE TO RELATED APPLICATION

This application claims priority to U.S. Provisional Application Ser. No. 63/376,588 entitled FULLY SELF-ALIGNED DIRECT BACKSIDE CONTACT FOR BSPDN, filed in the USPTO on Sep. 21, 2022, the disclosure of which is hereby incorporated by reference herein in its entirety.

BACKGROUND

The present disclosure generally relates to the field of integrated circuit devices and, more particularly, to integrated circuit devices including a backside power distribution network (BSPDN) structure.

Various structures of an integrated circuit device and methods of forming the same have been proposed to increase the integration density of the integrated circuit device. Specifically, an integrated circuit device including elements formed in a substrate or on a backside of the substrate has been proposed to simplify the middle-of-line (MOL) portion and/or the back-end-of-line (BEOL) portion of device fabrication.

SUMMARY

A method of forming an integrated circuit device according to some embodiments may include providing a substrate structure including a substrate, a bottom insulator on the substrate and a semiconductor region between the substrate and the bottom insulator, the semiconductor region extending in a first direction; forming first and second preliminary transistor structures on the bottom insulator, wherein the first and second preliminary transistor structures may be spaced apart from each other in the first direction, and the bottom insulator may include first and second portions that the first and second preliminary transistor structures respectively overlap, and a third portion between the first and second portions; replacing the third portion of the bottom insulator with a bottom semiconductor layer; forming a source/drain region between the first and second preliminary transistor structures and on the bottom semiconductor layer; replacing the substrate and the semiconductor region with a backside insulator; forming a power contact in the backside insulator, wherein the source/drain region may overlap the power contact; and forming a power rail, wherein the power contact may be between the source/drain region and the power rail.

A method of forming an integrated circuit device according to some embodiments may include providing a substrate structure including a semiconductor region and a bottom insulator on the semiconductor region; forming first and second preliminary transistor structures that may be on the bottom insulator and may be spaced apart from each other in a first direction, the bottom insulator including first and second portions that the first and second preliminary transistor structures respectively overlap, and a third portion between the first and second portions; replacing the third portion of the bottom insulator with a bottom semiconductor layer; forming a source/drain region between the first and second preliminary transistor structures, wherein a lower surface of the source/drain region may contact the bottom semiconductor layer; forming a power contact, wherein an upper surface of the power contact may face the lower surface of the source/drain region; and forming a power rail on a lower surface of the power contact.

An integrated circuit device according to some embodiments may include a backside insulator; a transistor that may be on the backside insulator and may include a source/drain region and a gate structure; a bottom insulator extending between the transistor and the backside insulator and including a lower surface contacting the backside insulator; and a power contact structure that may include a lower portion extending through the backside insulator and an upper portion that may extend through the bottom insulator and may contact a lower surface of the source/drain region. The lower surface of the source/drain region may have a first width in a first direction, an interface between the source/drain region and the power contact structure may have a second width in the first direction, and the first width may be wider than the second width, and a portion of the bottom insulator may separate the source/drain region from the lower portion of the power contact structure.

DETAILED DESCRIPTION

According to some embodiments, an integrated circuit device may include a power contact that includes a portion self-aligned with a source/drain region. Therefore, the integrated circuit device may be formed without forming a placeholder (also referred to as a sacrificial layer) that is used to ensure the alignment between the source/drain region and the power contact. After the power contact is formed, a BSPDN structure may be formed on the power contact. The BSPDN structure may simplify the MOL portion and/or the BEOL portion of device fabrication.

Example embodiments will be described in greater detail with reference to the attached figures.

Figure 1:
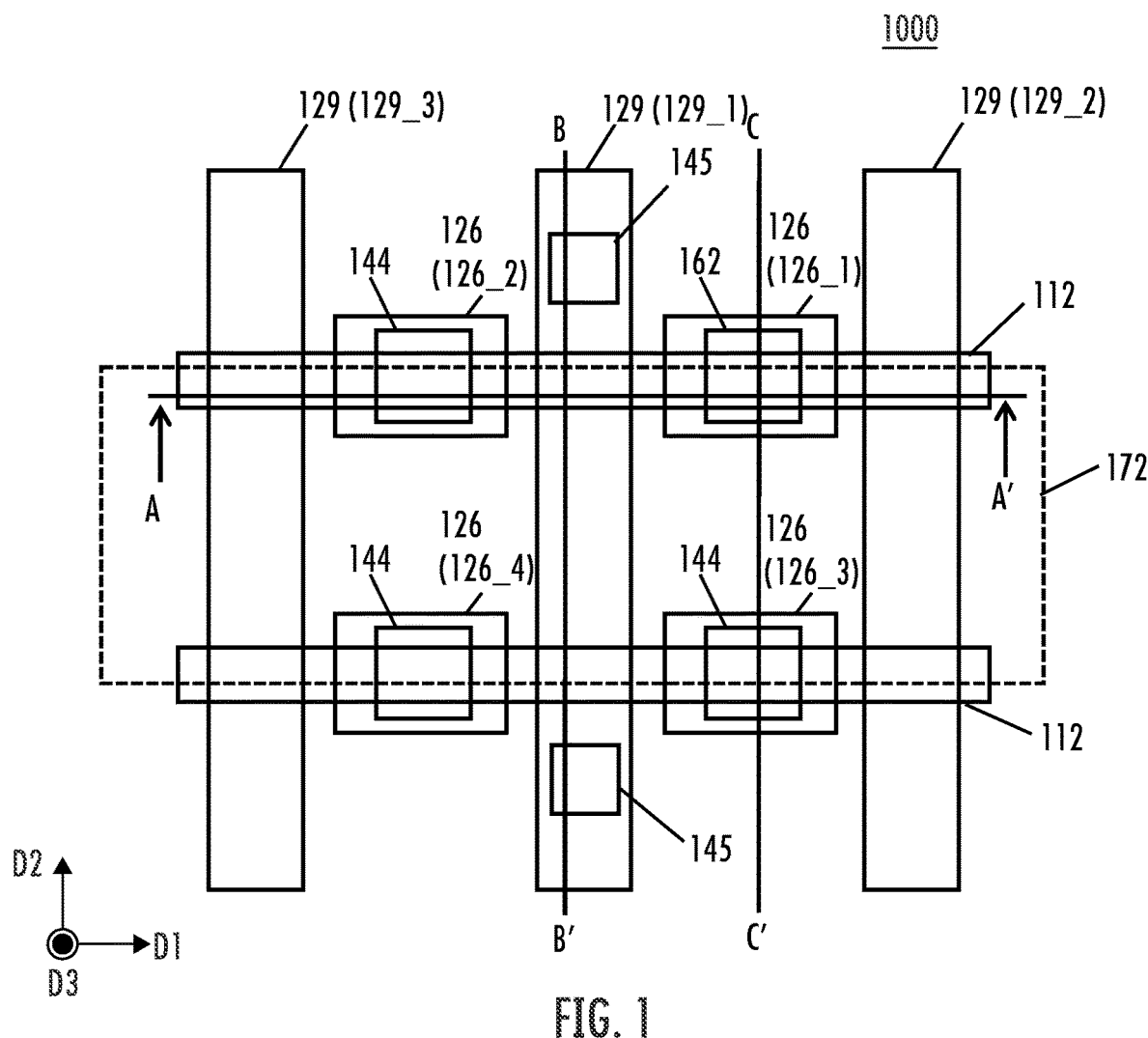
FIG. 1 is a layout of an integrated circuit device according to some embodiments.
Figure 2:
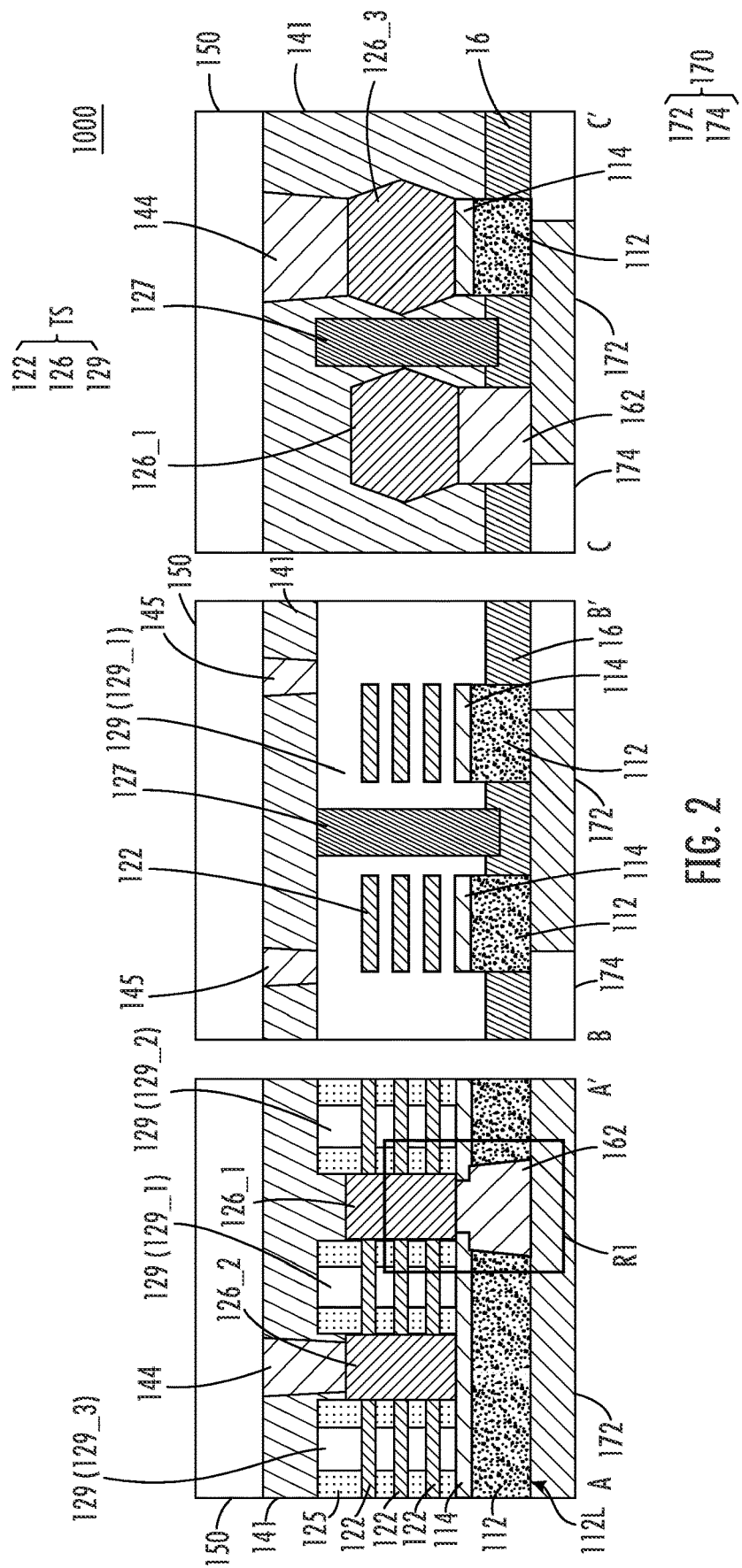
FIG. 2 shows cross-sectional views of an integrated circuit device taken along the line A-A', the line B-B' and line C-C', respectively, in FIG. 1 according to some embodiments.

FIG. 1 is a layout of an integrated circuit device according to some embodiments. FIG. 2 shows cross-sectional views of a first integrated circuit device 1000 taken along the line A-A', the line B-B' and line C-C', respectively, in FIG. 1 according to some embodiments. Referring to FIGS. 1 and 2, the first integrated circuit device 1000 may include a first backside insulator 112 (also referred to as a backside insulator), a transistor structure TS on the first backside insulator 112, and a bottom insulator 114 between the first backside insulator 112 and the transistor structure TR. The first integrated circuit device 1000 may include multiple first backside insulators 112 that extend in a first direction D1 (also referred to as a first horizontal direction) and are spaced apart from each other in a second direction D2 (also referred to as a second horizontal direction). Adjacent first backside insulators 112 may be separated from each other by a portion of a trench isolation layer 16. As used herein, "an element A extends in a direction X" (or similar language) may mean that the element A extends longitudinally in the direction X. The first direction D1 and the second direction D2 may be parallel to a lower surface 112L of the first backside insulator 112. The first direction D1 may be perpendicular to the second direction D2.

Each of the trench isolation layer 16, the first backside insulator 112 and the bottom insulator 114 may include an insulating material(s) (e.g., silicon oxide, silicon oxynitride, silicon nitride, silicon carbonitride, silicon boron nitride and/or a low-k material). The first backside insulator 112 may include a material having an etch selectivity with respect to the bottom insulator 114. In some embodiments, the first backside insulator 112 may include a SiO layer, and the bottom insulator 114 may include a SiBN layer. The low-k material may include, for example, fluorine-doped silicon oxide, organosilicate glass, carbon-doped oxide, porous silicon dioxide, porous organosilicate glass, spin-on organic polymeric dielectrics and/or spin-on silicon based polymeric dielectric.

The transistor structure TR may include a gate structure 129 (e.g., a first gate structure 129_1) and a channel region 122 that comprises a portion provided in the gate structure 129. The channel region 122 may extend through the gate structure 129 in the first direction D1. The transistor structure TR may also include a pair of source/drain regions 126 (e.g., a first source/drain region 126_1 and a second source/drain region 126_2) that are on opposing side surfaces of the gate structure 129, respectively. The channel region 122 may include opposing side surfaces that are spaced apart from each other in the first direction D1 and respectively contact the pair of source/drain regions 126. The transistor structure TR may include multiple channel regions 122 stacked in a third direction D3 (also referred to as a vertical direction). In some embodiments, the transistor structure TR may include three channel regions 122 stacked in the third direction D3 as illustrated in FIG. 2. The third direction D3 may be perpendicular to the lower surface 112L of the first backside insulator 112.

The channel region 122 may include semiconductor material(s) (e.g., Si, Ge, SiGe, GaP, GaAs, SiC, SiGeC and/or InP). In some embodiments, the channel region 122 may be a nanosheet that may have a thickness in a range of from 1 nanometers (nm) to 100 nm in the third direction D3 or may be a nanowire that may have a circular cross-section with a diameter in a range of from 1 nm to 100 nm. Each of the source/drain regions 126 (e.g., first to fourth source/drain regions 126_1, 126_2, 126_3 and 126_4) may include a semiconductor layer (e.g., a silicon layer and/or a silicon germanium layer) and may additionally include dopants in the semiconductor layer. In some embodiments, each of the source/drain regions 126 may include a metallic layer that includes, for example, tungsten (W), aluminum (Al), copper (Cu), molybdenum (Mo), cobalt (Co) and/or ruthenium (Ru).

The first integrated circuit device 1000 may include multiple gate structures 129 (e.g., first, second and third gate structures 129_1, 129_2, and 129_3) that extend in the second direction D2 and are spaced apart from each other in the first direction D1. The gate structure 129 may include a gate electrode. The gate structure 129 may also include a gate insulator that separates the gate electrode from the channel region 122. The gate insulator may include a silicon oxide layer and/or a high-k material layer. The high-k material layer may include, for example, $Al_2O_3$, $HfO_2$, $ZrO_2$, $HfZrO_4$, $TiO_2$, $Sc_2O_3$ $Y_2O_3$, $La_2O_3$, $Lu_2O_3$, $Nb_2O_5$ and/or $Ta_2O_5$. The gate electrode may include a metallic layer that includes, for example W, Al, Cu, Mo, Co and/or Ru and may additionally include work function layer(s) (e.g., a TiN layer, a TaN layer, a TiAl layer, a TiC layer, a TiAlC layer, a TiAlN layer and/or a WN layer).

An insulating spacer 125 (also referred to as a gate spacer or an inner gate spacer) may be provided between the gate structure 129 and the source/drain region 126 to separate the gate structure 129 from the source/drain region 126. The insulating spacer 125 may include, for example, silicon oxide, silicon oxynitride, silicon nitride, silicon carbonitride, silicon boron nitride and/or a low-k material. The channel region 122 may extend through the insulating spacer 125 to contact the source/drain regions 126 on opposing sides of the gate structure 129 in the first direction D1.

A source/drain contact 144 may be provided on the source/drain region 126 (e.g., the second source/drain region 126_2 or the third source/drain region 1263) that includes a lower surface facing the first backside insulator 112 and an upper surface opposite to the lower surface. The source/drain contact 144 may contact the upper surface of the source/drain region 126, and the bottom insulator 114 may contact the lower surface of the source/drain region 126. As used herein, "a lower surface" refers to a surface facing the first backside insulator 112, and "an upper surface" refers to a surface opposite the lower surface. Further, as used herein, "a lower portion" refers to a portion that is closer than "an upper portion" to the first backside insulator 112.

A gate contact 145 may be provided on the gate structure 129 (e.g., the first gate structure 129_1). The gate contact 145 may contact an upper surface of the gate structure 129. In some embodiments, the gate structure 129 may include portions that are spaced apart from each other in the second direction D2, and a gate isolation layer 127 may separate those portions of the gate structure 129 from each other. In some other embodiments, the gate isolation layer 127 may be omitted.

An interlayer 141 may be provided on the transistor structures TR and the source/drain regions 126. The source/drain contacts 144 and the gate contacts 145 may be provided in the interlayer 141. A lower surface of the interlayer 141 may contact an upper surface of the trench isolation layer 16. Each of the gate isolation layer 127 and the interlayer 141 may include an insulating material(s) (e.g., silicon oxide, silicon oxynitride, silicon nitride, silicon carbonitride, silicon boron nitride and/or a low-k material).

The first integrated circuit device 1000 may further include a power contact structure 162 that is electrically connected to the source/drain region 126 (e.g., the first source/drain region 126_1). The power contact structure 162 may contact a lower surface of the source/drain region 126.

A BSPDN structure 170 may be provided on a lower surface of the power contact structure 162. The BSPDN structure 170 may include a second backside insulator 174 and a power rail 172 provided in the second backside insulator 174. The power rail 172 may extend in the first direction D1. The power rail 172 may contact the lower surface of the power contact structure 162, a lower surface of the first backside insulator 112 and a lower surface of the trench isolation layer 16, as illustrated in FIG. 2. The power rail 172 may be electrically connected to a power source with a predetermined voltage (e.g., a drain voltage or a source voltage). The first source/drain region 126_1 may be electrically connected to the power source through the power contact structure 162 and the power rail 172.

Each of the source/drain contact 144, the gate contact 145, the power contact structure 162, and the power rail 172 may include a metallic layer including, for example, W, Co, Mo, Ru, Al and/or Cu. In some embodiments, each of the source/drain contact 144 and the gate contact 145 may include a Co layer and/or a W layer, and each of the power contact structure 162 and the power rail 172 may include a Cu layer. An upper portion of the power contact structure 162 may include a metal silicide layer, and the metal silicide layer may contact the lower surface of the first source/drain region 126_1. In some embodiments, a barrier layer may be provided on a surface of each of the source/drain contact 144, the gate contact 145, the power contact structure 162, and the power rail 172. The barrier layer may include, for example, metal nitride layer(s) (e.g., a TiN layer and/or a TaN layer).

The first integrated circuit device 1000 may further include a BEOL structure 150 that is formed through the BEOL portion of device fabrication. The BEOL structure 150 may be formed on the source/drain contact 144 and the gate contact 145. The source/drain contact 144 may electrically connect the source/drain region 126 to a conductive element (e.g., a conductive wire or a conductive via plug) of the BEOL structure 150, and the gate contact 145 may electrically connect the gate structure 129 to a conductive element of the BEOL structure 150.

The BEOL structure 150 may include a BEOL insulating layer, conductive wires (e.g., metal wires) that are provided in the BEOL insulating layer and are stacked in the third direction D3, and conductive via plugs (e.g., metal via plugs), each of which may electrically connect two conductive wires that are spaced apart from each other in the third direction D3.

Figure 3:
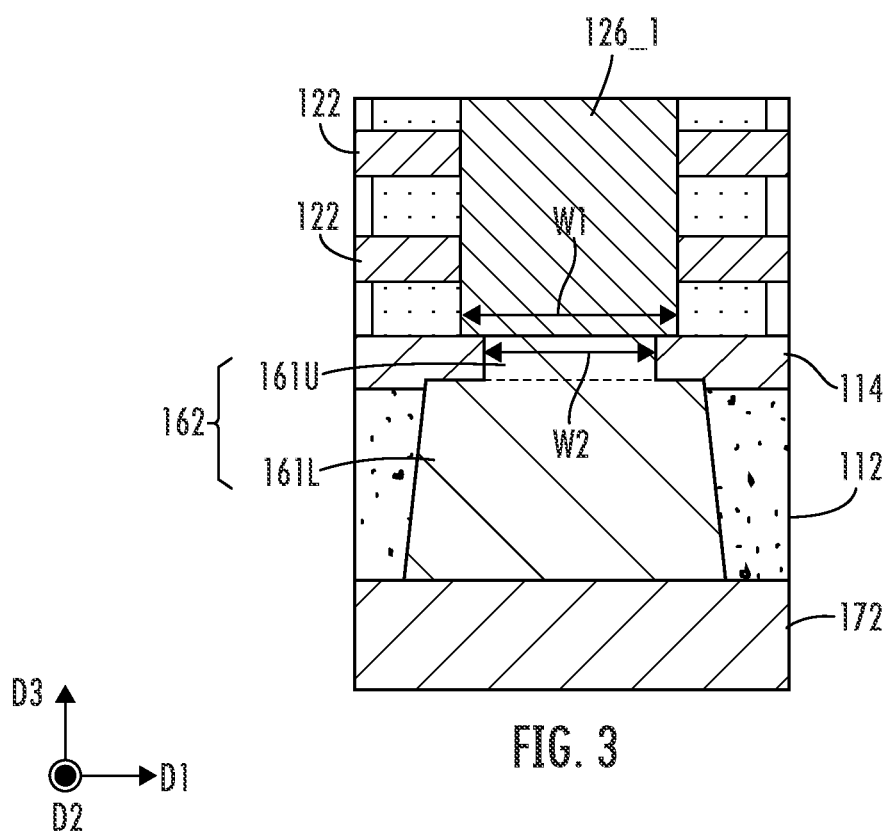
FIG. 3 is an enlarged view of the first region R1 in FIG. 2 according to some embodiments.

FIG. 3 is an enlarged view of the first region R1 in FIG. 2 according to some embodiments. Referring to FIG. 3, the power contact structure 162 may include a lower portion 161L that extends through the first backside insulator 112 and an upper portion 161U that extends through the bottom insulator 114 and contacts a lower surface of the source/drain region 126. In some embodiments, the lower surface of the source/drain region 126 may have a first width W1 in the first direction D1, an interface between the source/drain region 126 and the power contact structure 162 may have has a second width W2 in the first direction D1, and the first width W1 is wider than the second width W2. A portion of the bottom insulator 114 may separate the source/drain region 126 from the lower portion 161L of the power contact structure 162 and may contact the lower surface of the source/drain region 126 and an upper surface of the lower portion 161L of the power contact structure 162. In some embodiments, the upper portion 161U and the lower portion 161L of the power contact structure 162 respectively include portions of a single metallic layer. A width of the lower portion 161L of the power contact structure 162 in the first direction D1 may increase as a distance from the source/drain region 126 increases.

Figure 4:
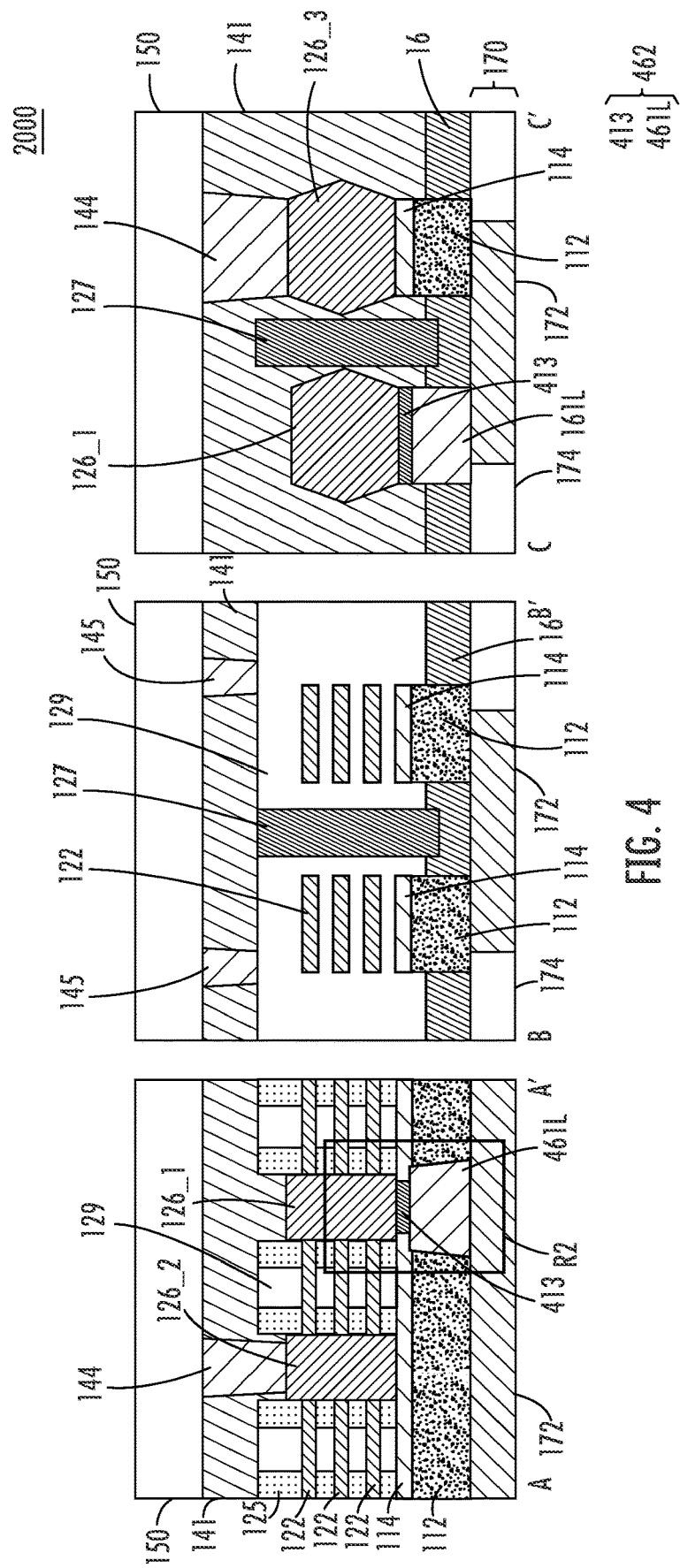
FIG. 4 shows cross-sectional views of an integrated circuit device taken along the line A-A', the line B-B' and line C-C', respectively, in FIG. 1 according to some embodiments.
Figure 5:
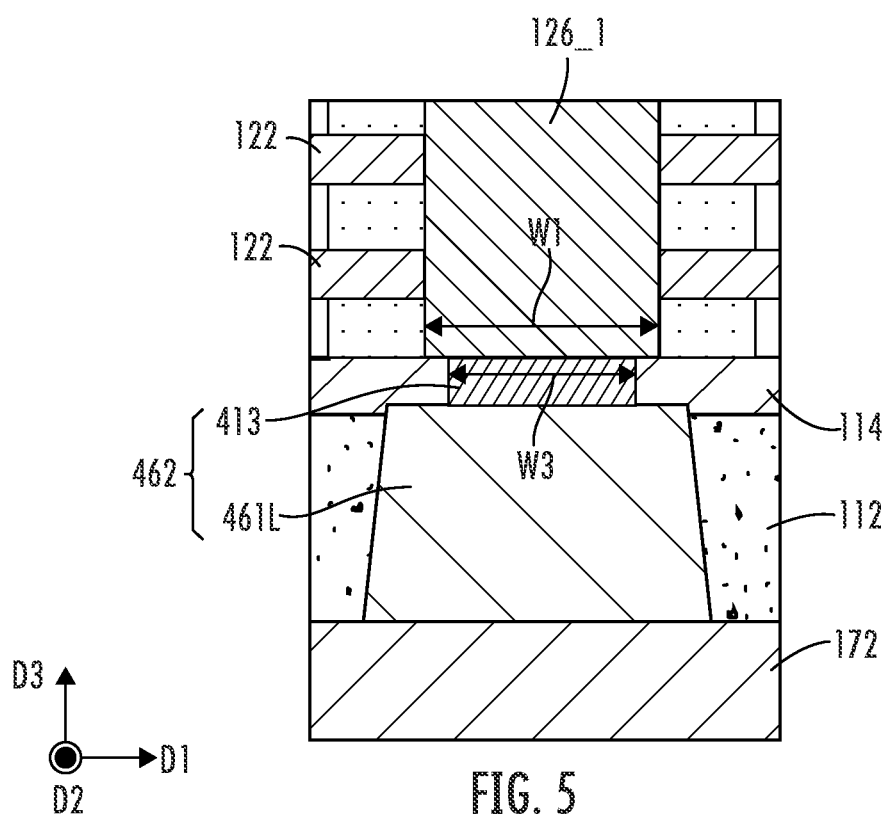
FIG. 5 is an enlarged view of the second region R2 in FIG. 4 according to some embodiments.

FIG. 4 shows cross-sectional views of a second integrated circuit device 2000 taken along the line A-A', the line B-B' and line C-C', respectively, in FIG. 1 according to some embodiments. FIG. 5 is an enlarged view of the second region R2 in FIG. 4 according to some embodiments. Referring to FIGS. 4 and 5, the second integrated circuit device 2000 is similar to the first integrated circuit device 1000. The second integrated circuit device 2000 may be different from the first integrated circuit device 1000, in that the power contact structure 462 may include a bottom semiconductor layer 413 that is between the source/drain region 126 and the lower portion 461L of the power contact structure 462. The bottom semiconductor layer 413 may extend through the bottom insulator 114 and may contact the lower surface of the source/drain region 126. The bottom semiconductor layer 413 may include, for example, semiconductor material(s) (e.g., Si, Ge, SiGe, GaP, GaAs, SiC, SiGeC and/or InP) In some embodiments, the bottom semiconductor layer 413 may be a silicon layer. In some embodiments, the lower portion 461L of the power contact structure 162 may include a metal silicide layer, and the metal silicide layer may contact the lower surface of the bottom semiconductor layer 413.

Referring to FIG. 5, in some embodiments, the lower surface of the source/drain region 126 may have a first width W1 in the first direction D1, an interface between the source/drain region 126 and the power contact structure 462 may have a third width W3 in the first direction D1, and the first width W1 is wider than the third width W3. A portion of the bottom insulator 114 may separate the source/drain region 126 from the lower portion 461L of the power contact structure 462 and may contact the lower surface of the source/drain region 126 and an upper surface of the lower portion 461L of the power contact structure 462.

Figure 6:
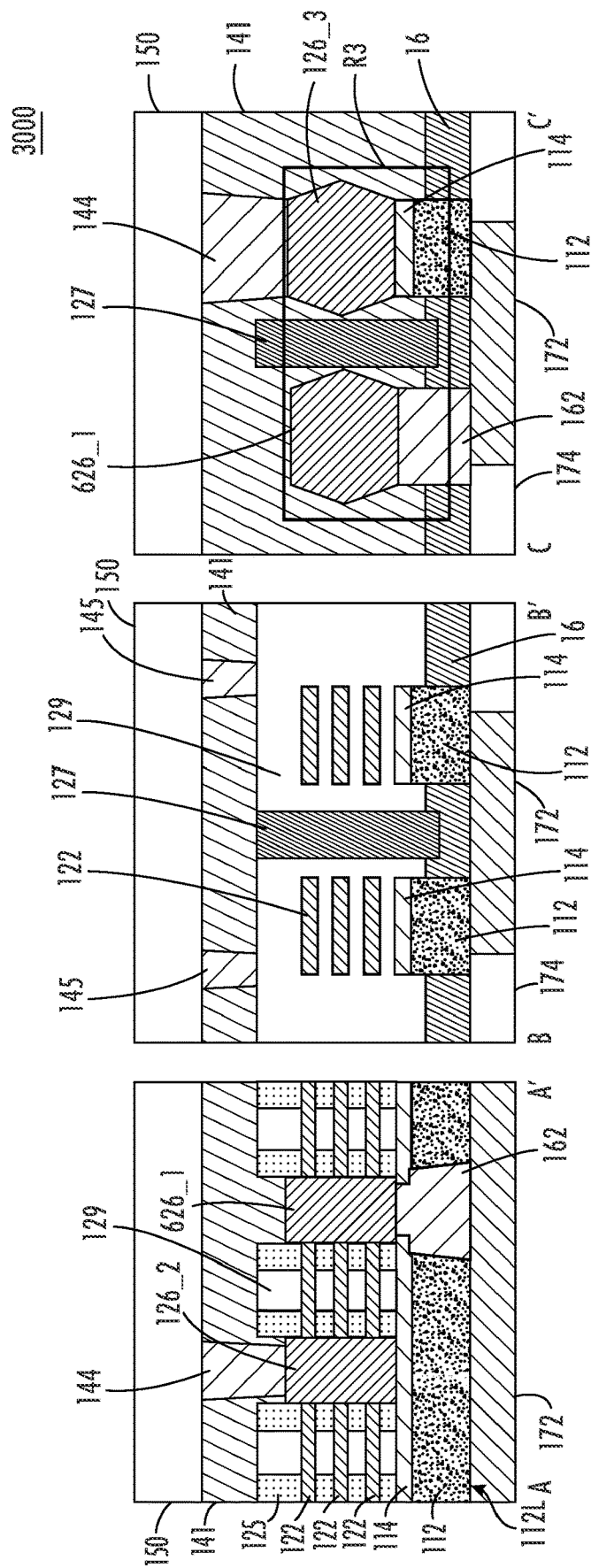
FIG. 6 shows cross-sectional views of an integrated circuit device taken along the line A-A', the line B-B' and line C-C', respectively, in FIG. 1 according to some embodiments.
Figure 7:
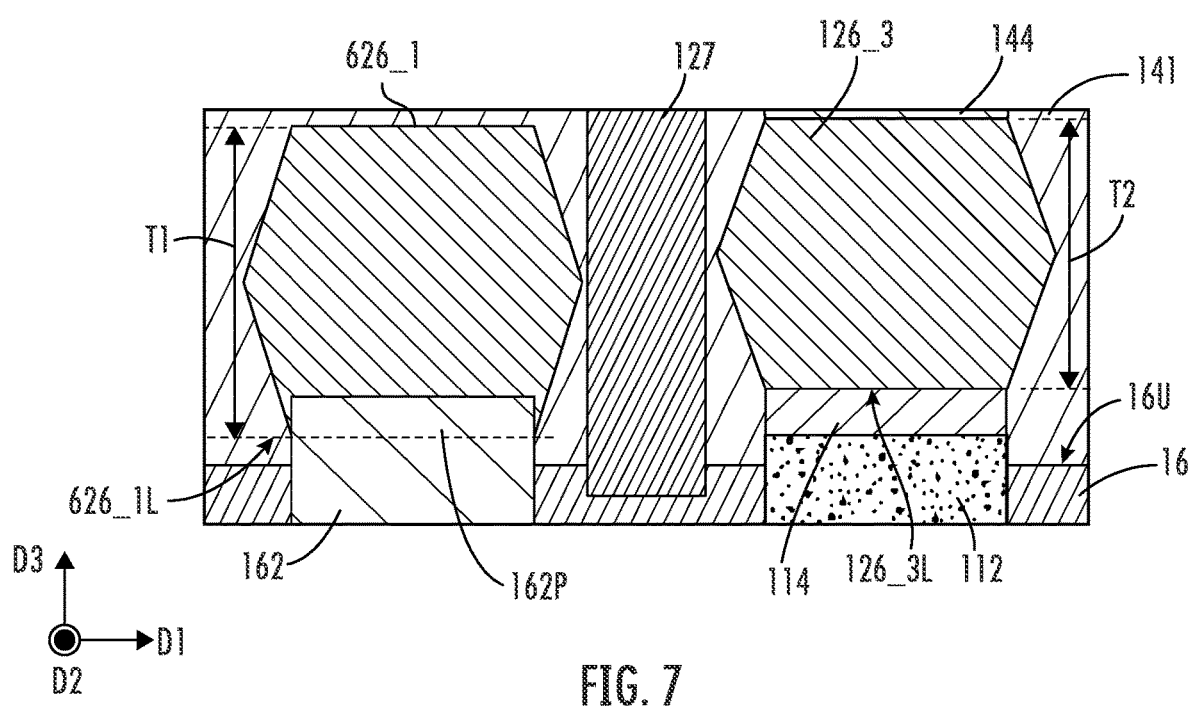
FIG. 7 is an enlarged view of the third region R3 in FIG. 6 according to some embodiments.

FIG. 6 shows cross-sectional views of a third integrated circuit device 3000 taken along the line A-A', the line B-B' and line C-C', respectively, in FIG. 1 according to some embodiments. FIG. 7 is an enlarged view of the third region R3 in FIG. 6 according to some embodiments. Referring to FIGS. 6 and 7, the third integrated circuit device 3000 is similar to the first integrated circuit device 1000. The third integrated circuit device 3000 may be different from the first integrated circuit device 1000, in that the first source/drain region 626_1 may have a first thickness T1 in the third direction D3 that is thicker than a second thickness T2 of the third source/drain region 126_3 in the third direction D3, and the power contact structure 162 may include a protruding portion 162P provided in the first source/drain region 626_1. A lower surface 626_1L of the first source/drain region 626_1 may be closer than a lower surface 126_3L of the third source/drain region 126_3 to an upper surface 6U of the trench isolation layer 16. In some embodiments, a side surface of the protruding portion 162P of the power contact structure 162 may contact the first source/drain region 626_1, as illustrated in FIG. 7.

Figure 8:
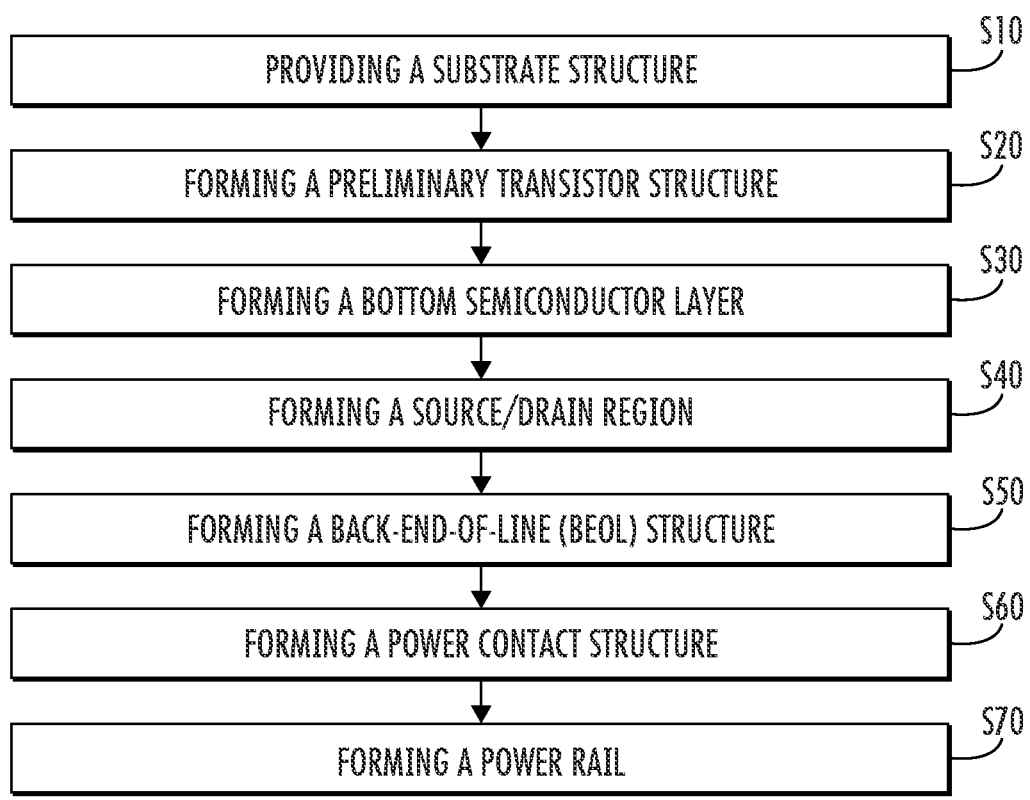
FIG. 8 is a flow chart of a method of forming an integrated circuit device according to some embodiments.

FIG. 8 is a flow chart of a method of forming an integrated circuit device according to some embodiments, and FIGS. 9 through 20 are cross-sectional views illustrating the method according to some embodiments. Specifically, FIGS. 9 through 20 illustrate the method of forming the first integrated circuit device 1000 according to some embodiments.

Figure 9:
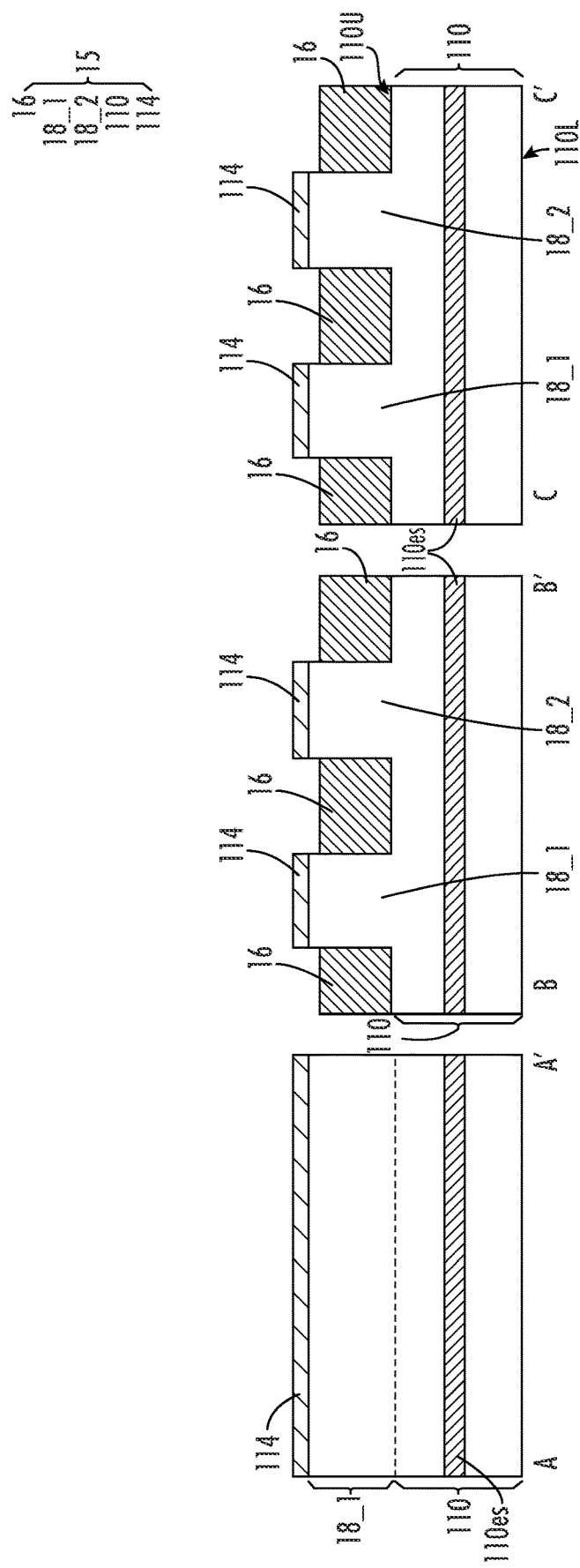
FIGS. 9 through 20 are cross-sectional views illustrating a method of forming an integrated circuit device according to some embodiments.

Referring to FIGS. 8 and 9, the method may include providing a substrate structure 15 (Block S10). The substrate structure 15 may include a substrate 110, a bottom insulator 114 on the substrate 110, a trench isolation layer 16, and first and second semiconductor regions 18_1 and 18_2 between the substrate 110 and the bottom insulator 114. The first and second semiconductor regions 18_1 and 18_2 may extend in the first direction D1 and may be spaced apart from each other in the second direction D2. A portion of the trench isolation layer 16 may be provided between the first and second semiconductor regions 18_1 and 18_2. The first and second semiconductor regions 18_1 and 18_2 may protrude from an upper surface 110U of the substrate 110 in the third direction D3. An upper surface of each of the first and second semiconductor regions 18_1 and 18_2 may contact a lower surface of the bottom insulator 114.

The substrate 110 may include one or more semiconductor materials, for example, Si, Ge, SiGe, GaP, GaAs, SiC, SiGeC and/or InP or may include insulating material, for example, silicon oxide, silicon oxynitride, silicon nitride, silicon carbonitride, silicon boron nitride and/or a low-k material. In some embodiments, the substrate 110 may be a bulk substrate (e.g., a bulk silicon substrate) or a semiconductor on insulator (SOI) substrate. For example, the substrate 110 may be a silicon wafer or may be an insulating layer. The substrate 110 may include an etch stop layer 110es, and the etch stop layer 110es may include, for example, SiN, SiBCN, SiOCN, SiBN, SiCN, SiO and/or SiON.

Figure 10:
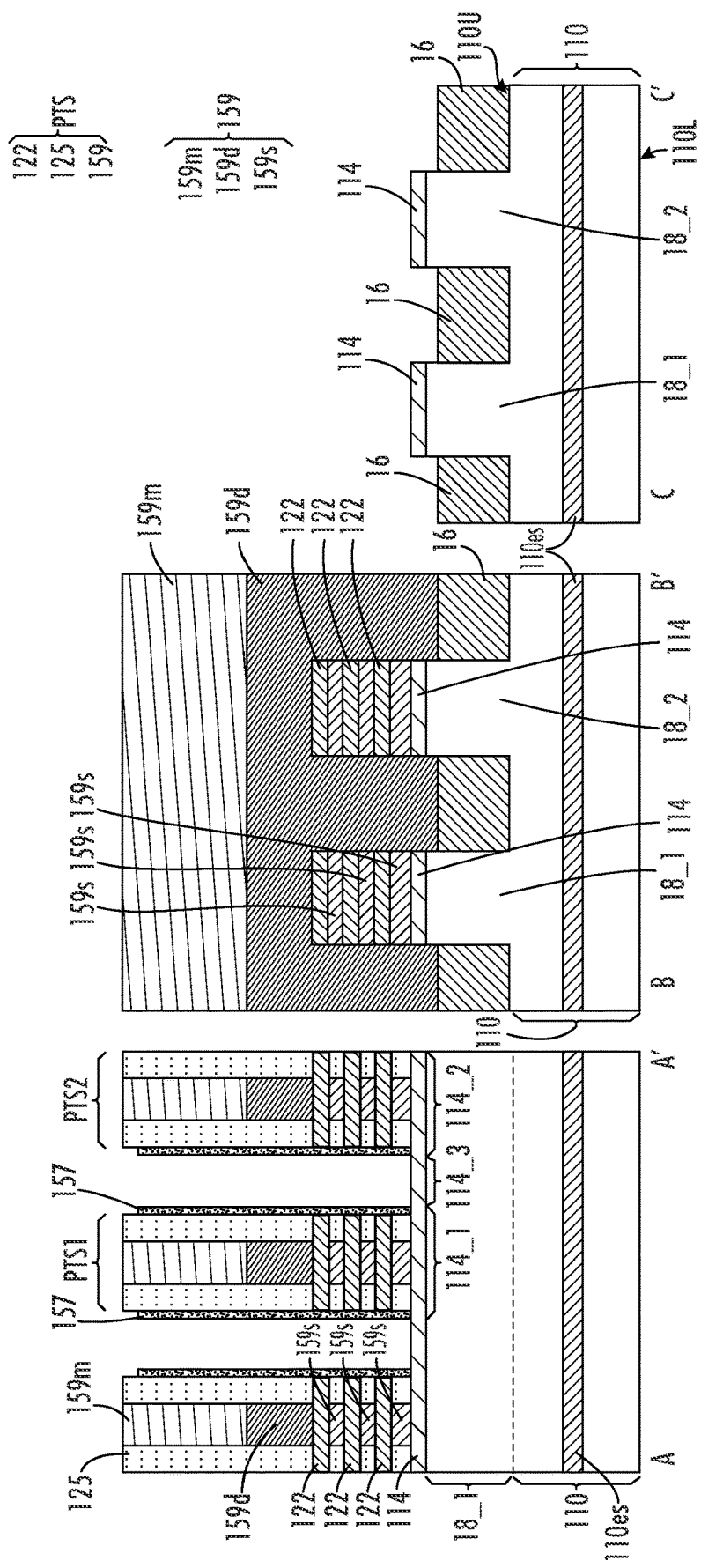

Referring to FIGS. 8 and 10, preliminary transistor structures PTS (e.g., first and second preliminary transistor structures PTS1 and PTS2) may be formed on the substrate structure 15 (Block S20). The preliminary transistor structure PTS may extend in the second direction D2 and may traverse the semiconductor region 18 (e.g., the first semiconductor region 18_1). The preliminary transistor structure PTS may include a channel region 122, a preliminary gate structure 159, and a gate spacer 125 on a side surface of the preliminary gate structure 159. The preliminary gate structure 159 may include sacrificial gate layer 159s, a dummy gate layer 159d, and a gate mask layer 159m, which are sequentially stacked on the substrate structure 15. In some embodiments, the preliminary transistor structure PTS may include multiple channel regions 122 and multiple sacrificial gate layers 159s that are alternately stacked with the channel regions 122, as illustrated in FIG. 10.

The sacrificial gate layer 159s may include a material having an etch selectivity with respect to the channel region 122. The sacrificial gate layer 159s may include, for example, semiconductor material(s) (e.g., Si, Ge, SiGe, GaP, GaAs, SiC, SiGeC and/or InP). In some embodiments, the sacrificial gate layer 159s may include a SiGe layer. The dummy gate layer 159d may also include a material having an etch selectivity with respect to the channel region 122. The dummy gate layer 159d may include, for example, semiconductor material(s) (e.g., Si, Ge, SiGe, GaP, GaAs, SiC, SiGeC and/or InP) and/or a layer including nitrogen (e.g., SiN, SiBCN, SiOCN, SiBN, SiCN and/or SiON). The gate mask layer 159m may include, for example, an inorganic material (e.g., SiN, SiBCN, SiOCN, SiBN, SiCN, SiON and/or a spin-on-glass material).

The bottom insulator 114 may include first and second portions 114_1 and 114_2 that the first and second preliminary transistor structures PTS1 and PTS2 respectively overlap in the third direction D3 and may also include a third portion 114_3 between the first and second portions 114_1 and 114_2. As used herein, "an element A overlapping an element B in a direction X" (or similar language) means that there is at least one line that extends in the direction X and intersects both the elements A and B.

In some embodiments, a gate liner 157 may be formed on the side surface of the preliminary gate structure 159. The gate liner 157 may include, for example, a layer including nitrogen (e.g., SiN, SiON, SiBCN, SiOCN, SiBN and/or SiCN) and may have a thickness, for example, in a range of from 1 nanometer (nm) to 5 nm (e.g., about 1 nm or 2 nm).

Figure 11:
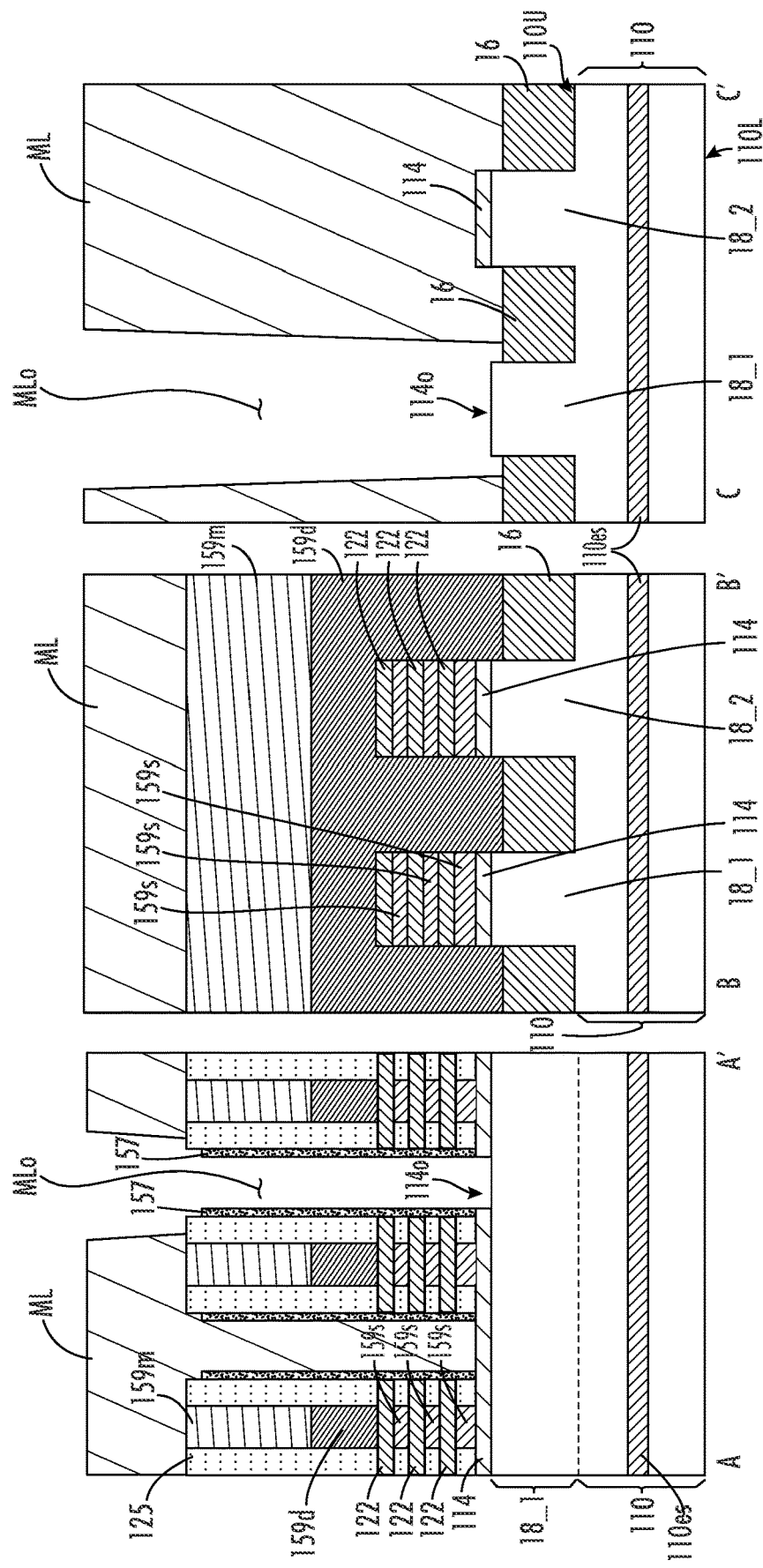

Referring to FIGS. 8 and 11 through 13, a bottom semiconductor layer 413 may be formed (Block S30). A mask layer ML including a mask opening MLo may be formed on the preliminary transistor structures PTS, and a bottom opening 114o may be formed in the bottom insulator 114, as illustrated in FIG. 11. The bottom opening 114o may be formed by removing the third portion 114_3 of the bottom insulator 114 using the mask layer ML, the preliminary transistor structures PTS, and the gate liner 157 as a mask. The bottom opening 114o may expose an upper surface and a portion of a side surface of the first semiconductor region 18_1. The mask layer ML may include an organic material (e.g., a photoresist) and/or an inorganic material (e.g., silicon oxynitride and/or a spin-on-glass material). The gate liner 157 may protect the channel region 122 while removing the third portion 114_3 of the bottom insulator 114.

Figure 12:
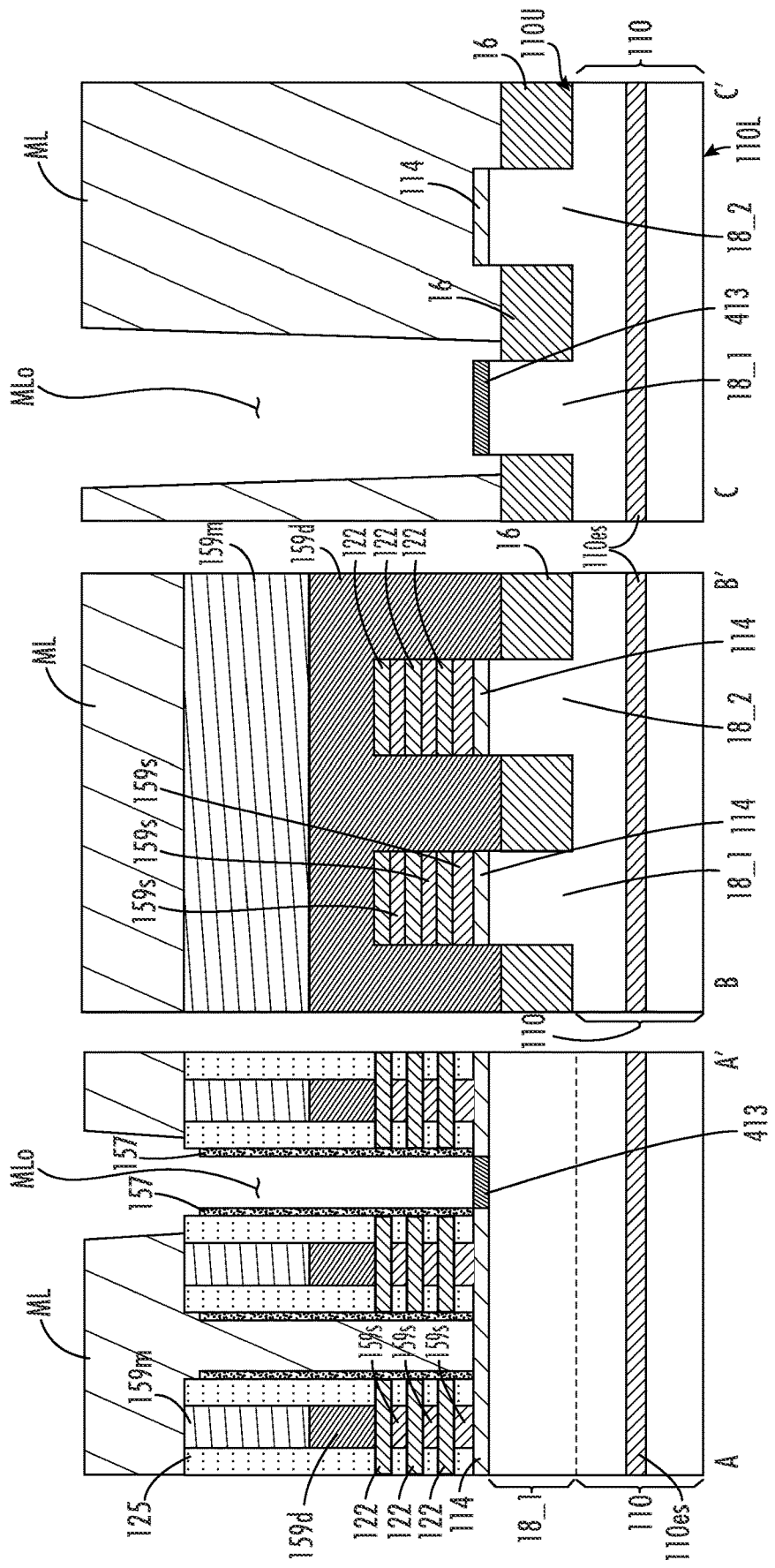
Figure 13:
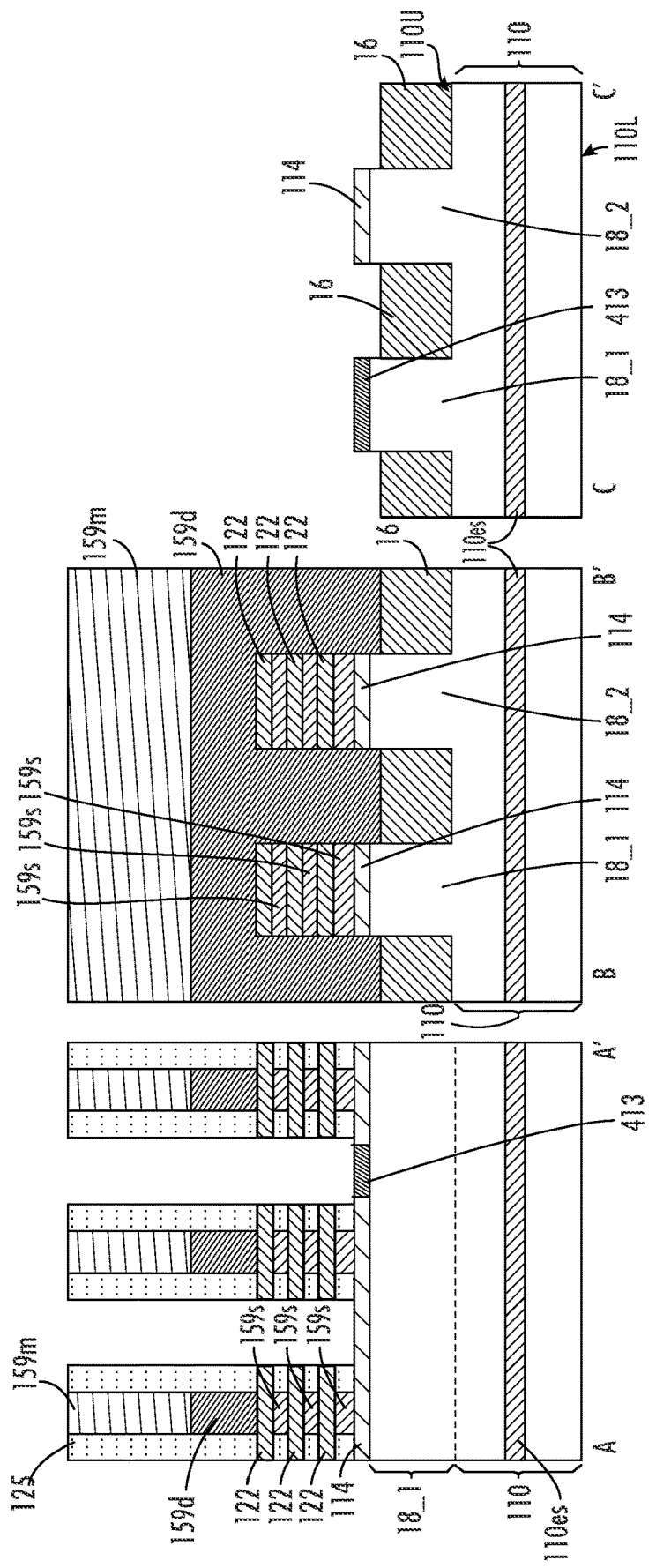

The bottom semiconductor layer 413 may be formed in the bottom opening 114o, as illustrated in FIG. 12. In some embodiments, the bottom semiconductor layer 413 may be grown to fill the bottom opening 114o by an epitaxial growth process using the first semiconductor region 18_1 as a seed layer such that the bottom semiconductor layer 413 is self-aligned with a source/drain region that is formed on the bottom semiconductor layer 413 through a subsequent process. The gate liner 157 covers sides surfaces of the channel region 122 such that an epitaxial layer may not be grown from the channel region 122 while forming the bottom semiconductor layer 413. The bottom semiconductor layer 413 may contact the upper surface of the first semiconductor region 18_1. The mask layer ML and the gate liner 157 may be removed after the bottom semiconductor layer 413 is formed as illustrated in FIG. 13. In some embodiments, the mask layer ML may be removed before the bottom semiconductor layer 413 is formed.

Figure 14:
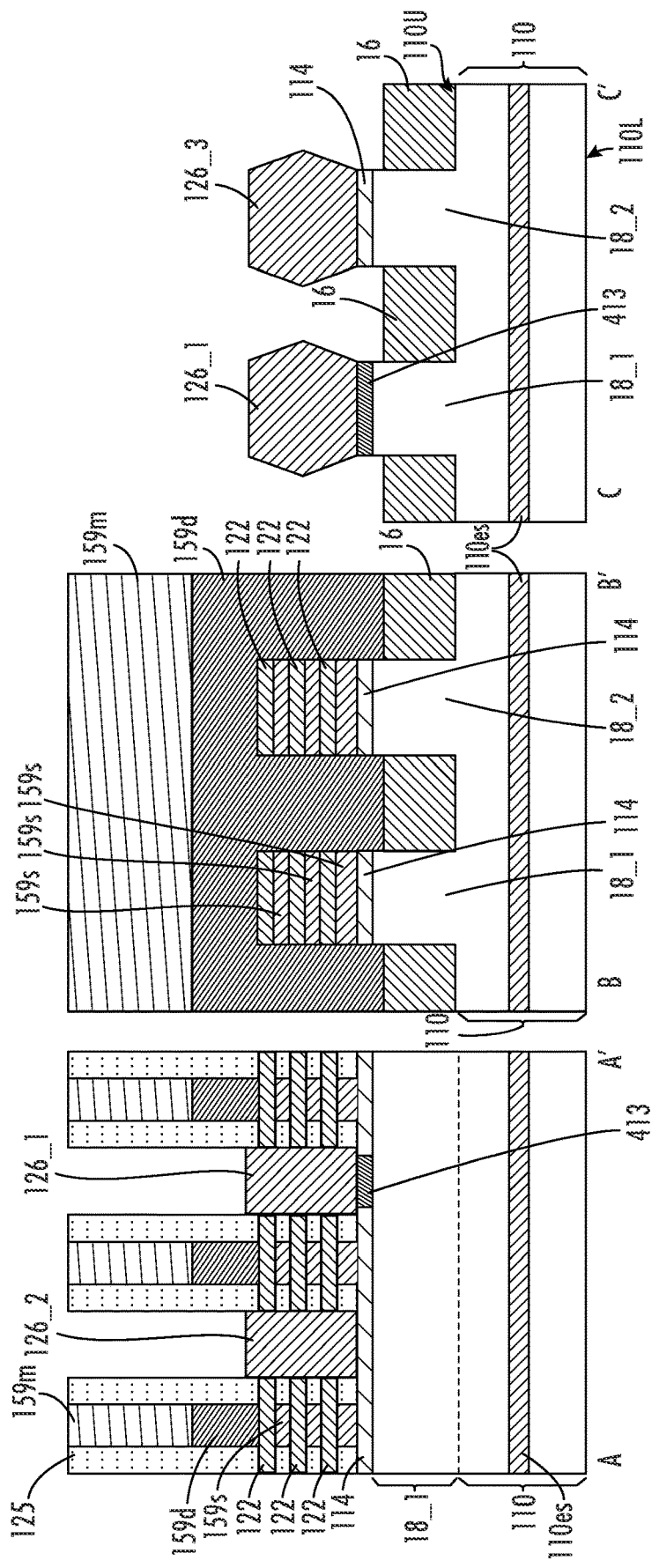

Referring to FIGS. 8 and 14, a source/drain region 126 (e.g., first to third source/drain regions 126_1, 126_2 and 126_3) may be formed (Block S40). The first source/drain region 126_1 may be formed on the bottom semiconductor layer 413, and a lower surface of the first source/drain region 126_1 may contact an upper surface of the bottom semiconductor layer 413. The source/drain region 126 may be formed by an epitaxial growth process using the channel region 122 as a seed layer and may contact the insulating spacer 125.

Figure 15:
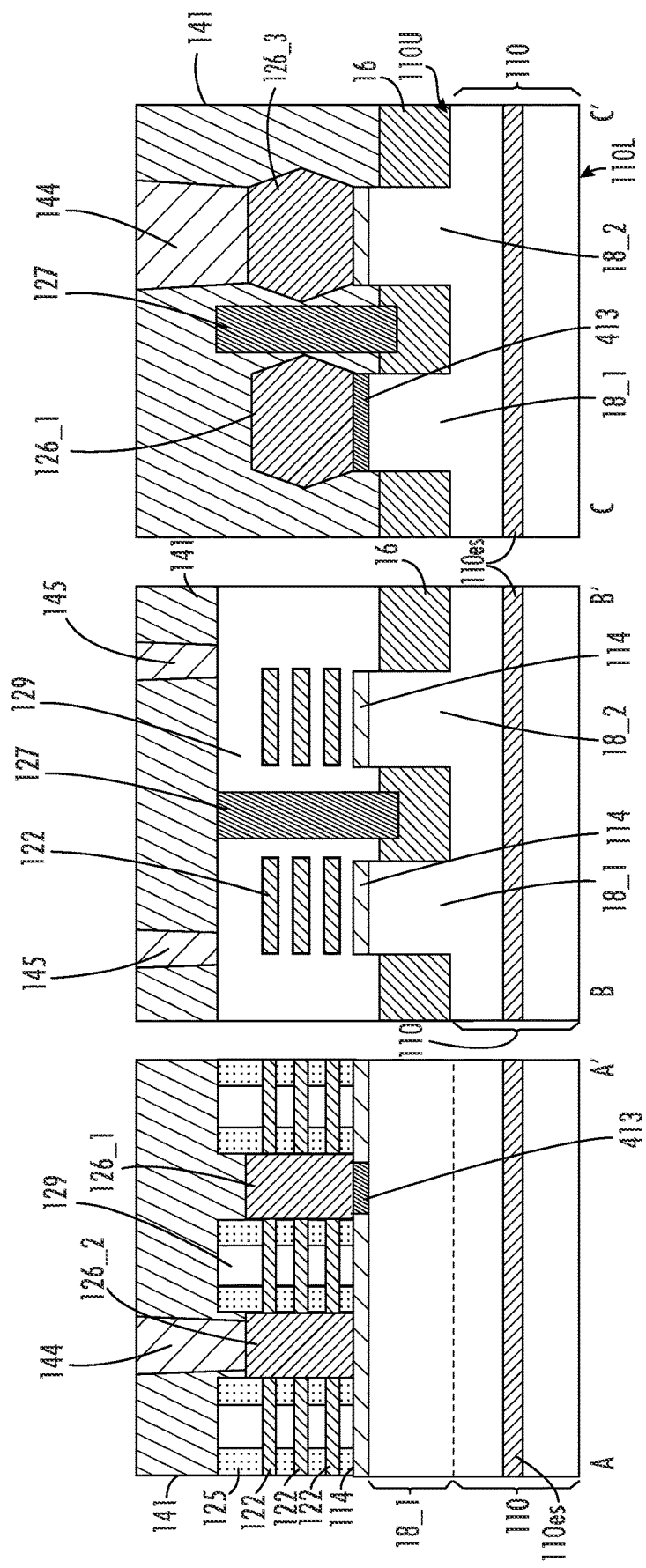
Figure 16:
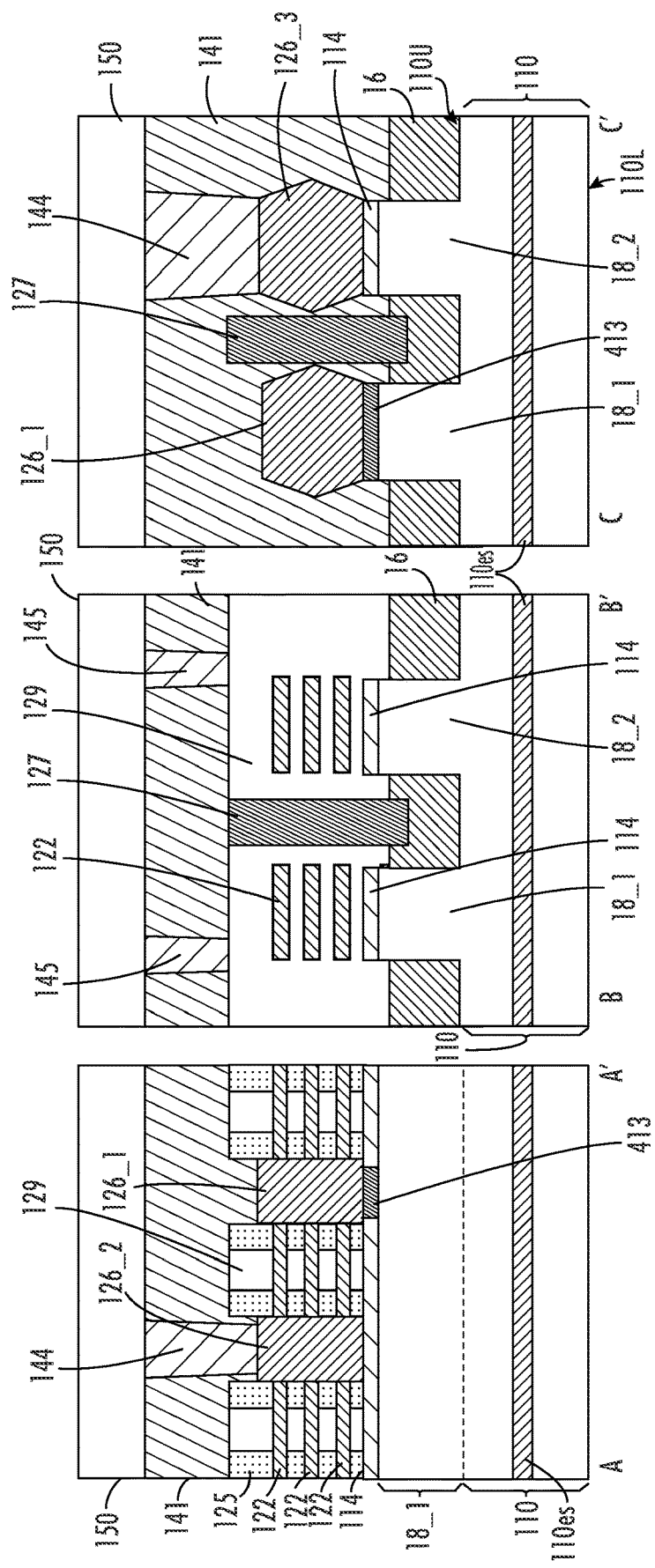

Referring to FIGS. 8, 15 and 16, a BEOL structure 150 may be formed (Block S50). The preliminary gate structure 159 may be replaced with a gate structure 129, and then an interlayer 141 may be formed on the gate structure 129. A gate isolation layer 127, source/drain contacts 144, gate contacts 145 may also be formed. The BEOL structure 150 may be formed on the source/drain contacts 144 and the gate contacts 145.

Figure 17:
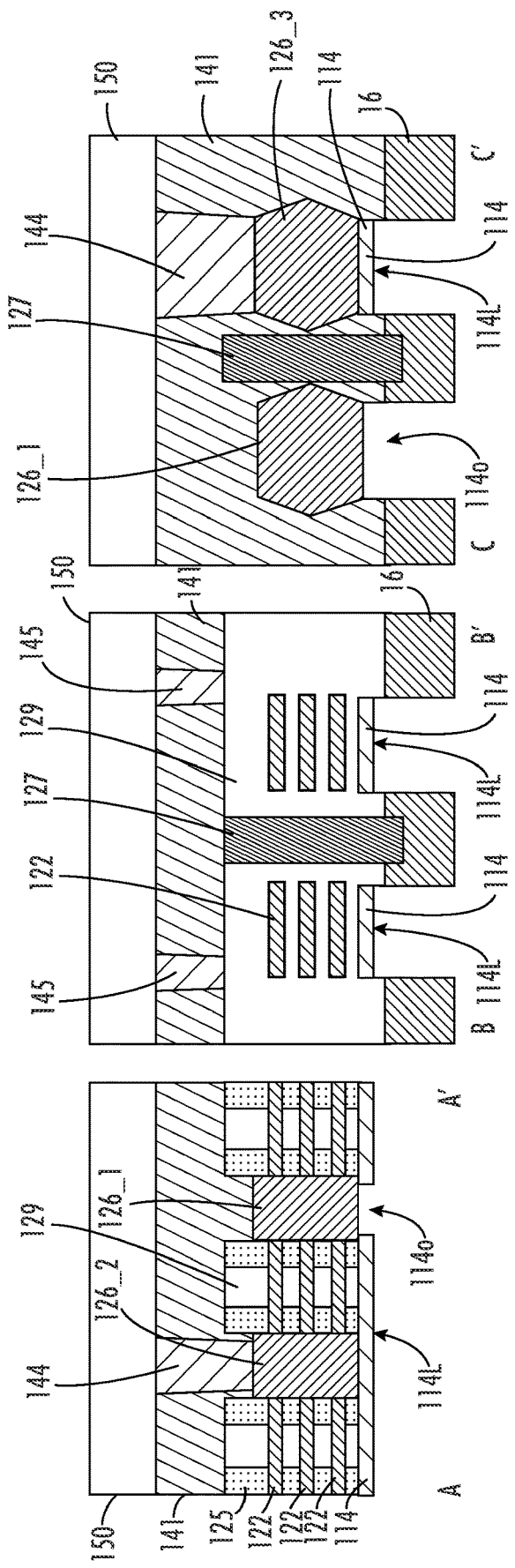

Referring to FIGS. 8 and 17 through 20, a power contact structure 162 may be formed (Block S60). The substrate 110, the first and second semiconductor regions 18_1 and 18_2 and the bottom semiconductor layer 413 may be removed by performing processes on a lower surface 110L of the substrate 110, thereby exposing a lower surface 114L of the bottom insulator 114, as illustrated in FIG. 17. Process(es) (e.g., a grinding process, a wet etching process, a dry etching process and/or a Chemical Mechanical Polishing (CMP)

process) may be performed to remove the substrate 110 and the first and second semiconductor regions 18_1 and 18_2. The bottom semiconductor layer 413 may be removed by etching process(es). The bottom opening 114o of the bottom insulator 114 may expose a lower surface of the first source/drain region 126_1.

Figure 18:
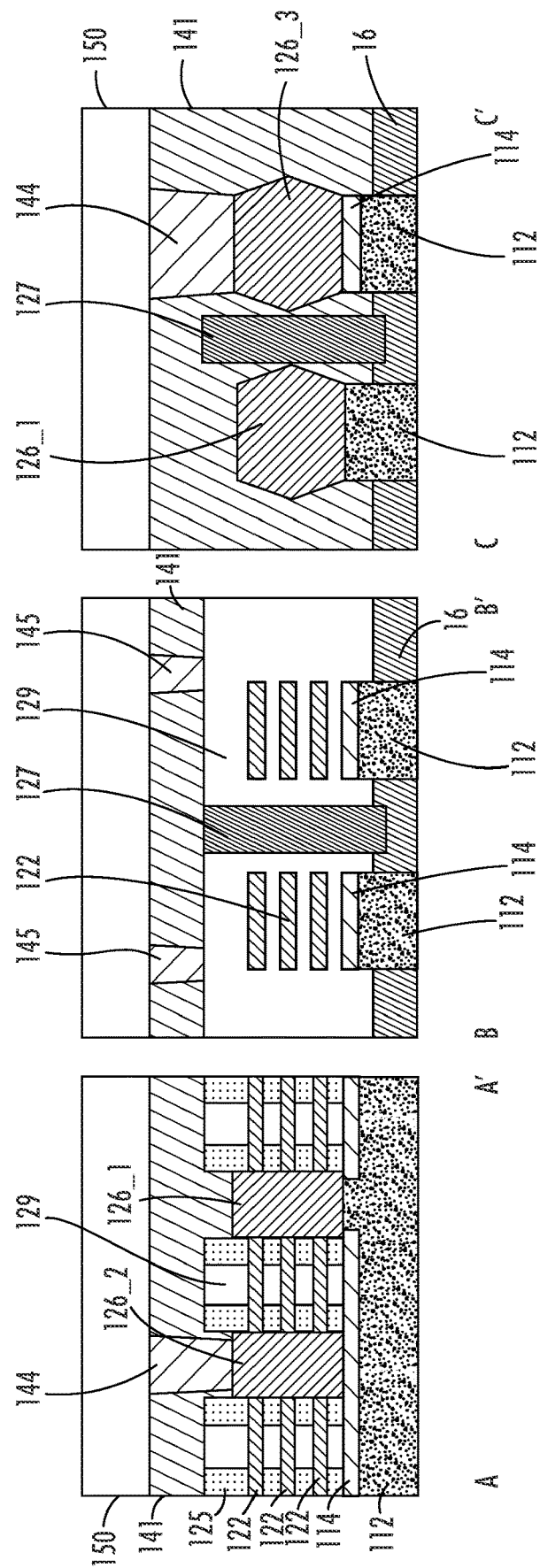
Figure 19:
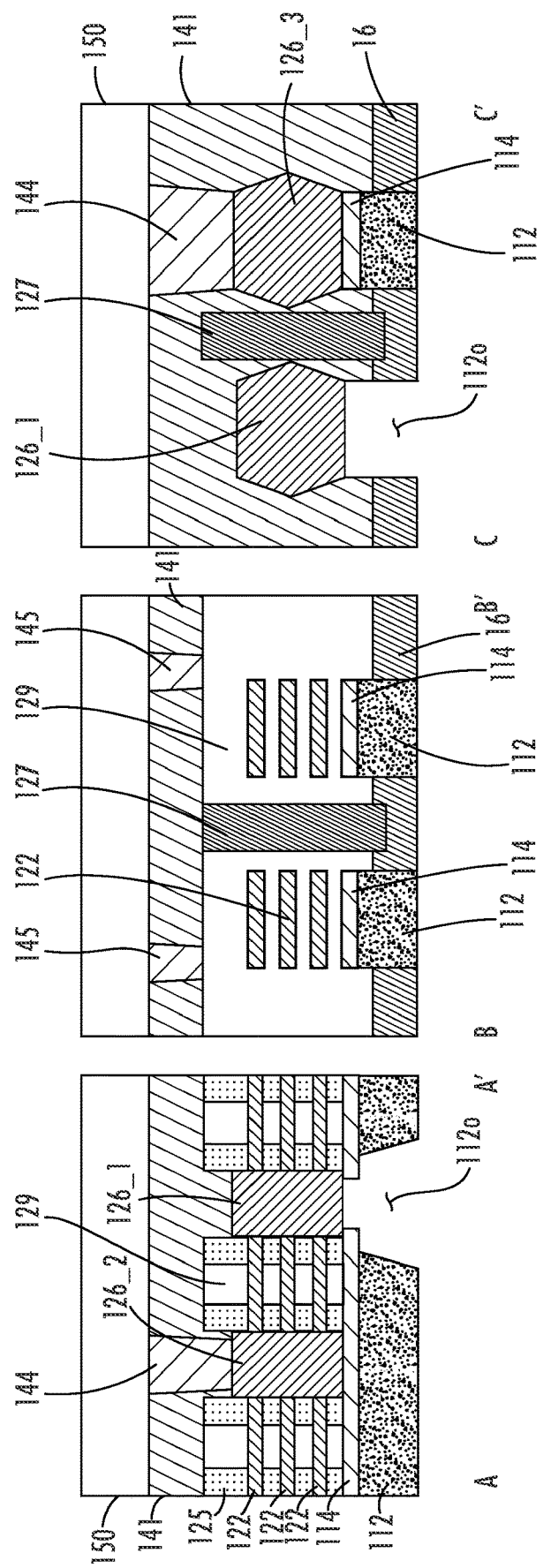
Figure 20:
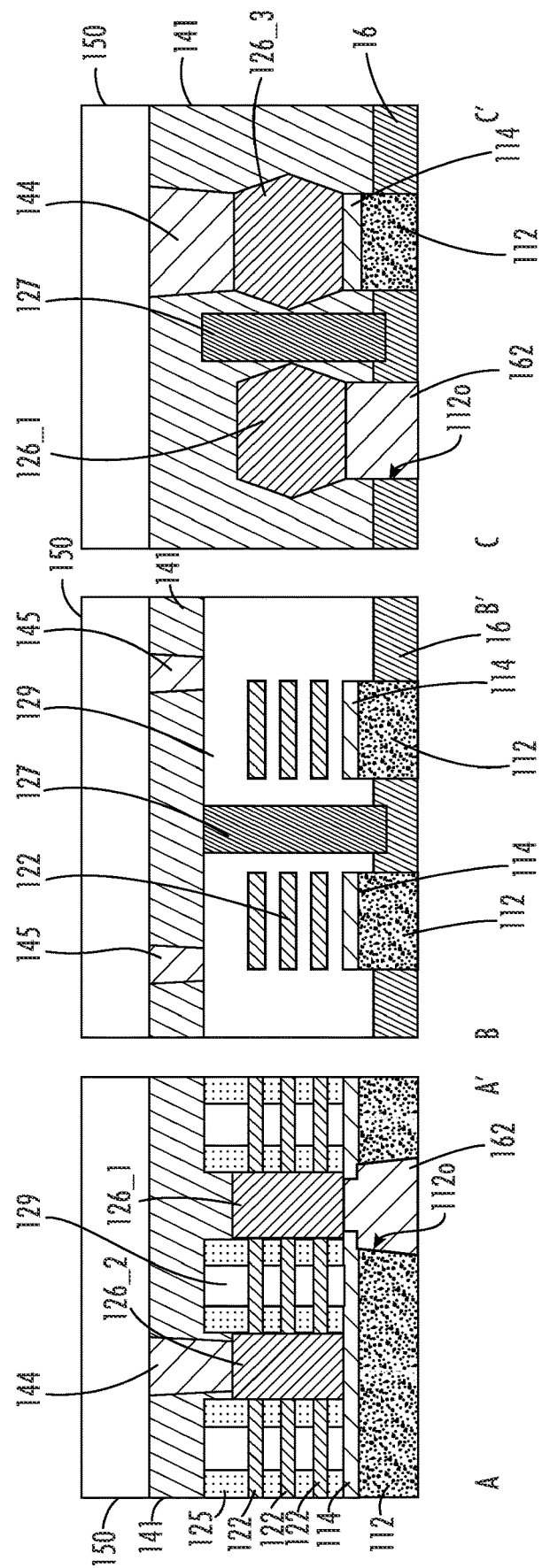

A first backside insulator 112 may be formed on the lower surface 114L of the bottom insulator 114, as illustrated in FIG. 18. A portion of the first backside insulator 112 may be formed in the bottom opening 114o of the bottom insulator 114. A backside opening 112o may be formed in the first backside insulator 112, and the backside opening 112o may expose the lower surface of the first source/drain region 126_1, as illustrated in FIG. 19. The power contact structure 162 may be formed in the backside opening 112o, and the power contact structure 162 may contact the lower surface of the first source/drain region 126_1, as illustrated in FIG. 20.

Referring to FIGS. 2 and 8, a power rail 172 may be formed on the power contact structure 162 (e.g., a lower surface of the power contact structure 162) (Block S70). The power rail 172 may contact the lower surface of the power contact structure 162.

Figure 21:
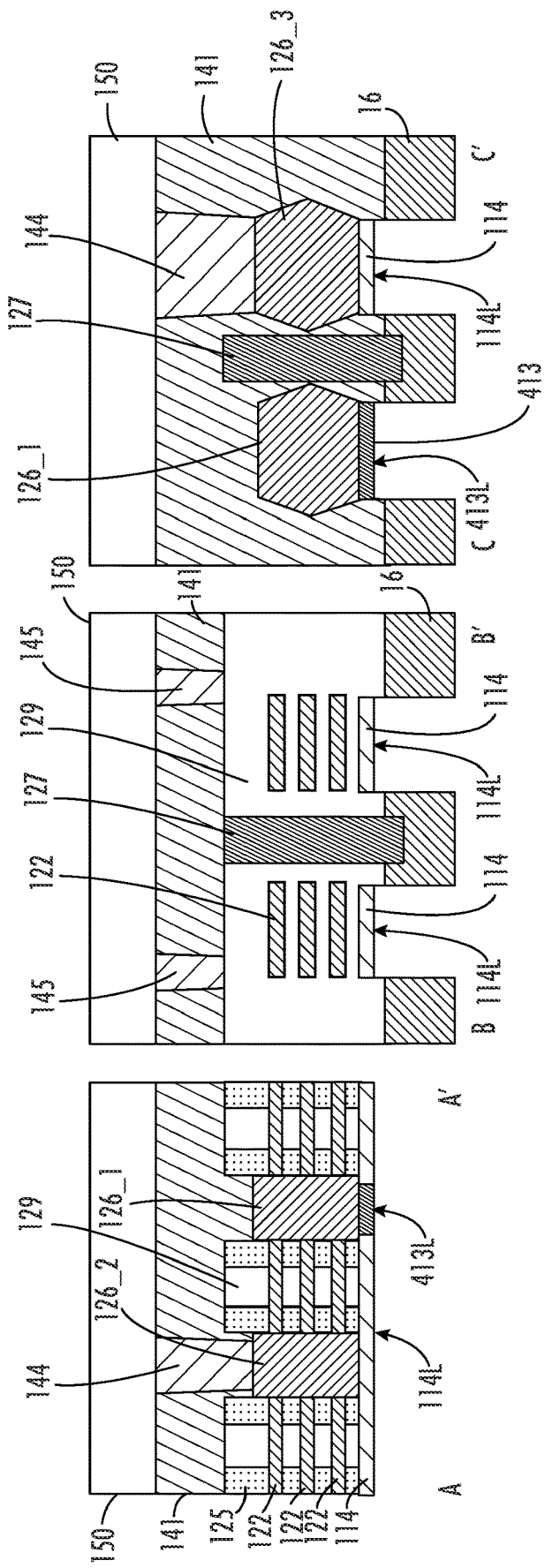
FIGS. 21 and 24 are cross-sectional views illustrating a method of forming an integrated circuit device according to some embodiments.

FIGS. 21 through 24 are cross-sectional views illustrating the method according to some embodiments. Specifically, FIGS. 21 through 24 illustrate the method of forming the second integrated circuit device 2000 according to some embodiments. As illustrated in FIG. 21, after the processes illustrated in FIGS. 9 through 16 are performed, the substrate 110 and the first and second semiconductor regions 18_1 and 18_2 may be removed by performing processes on a lower surface 110L of the substrate 110, thereby exposing a lower surface 114L of the bottom insulator 114 and a lower surface 413L of the bottom semiconductor layer 413.

Figure 22:
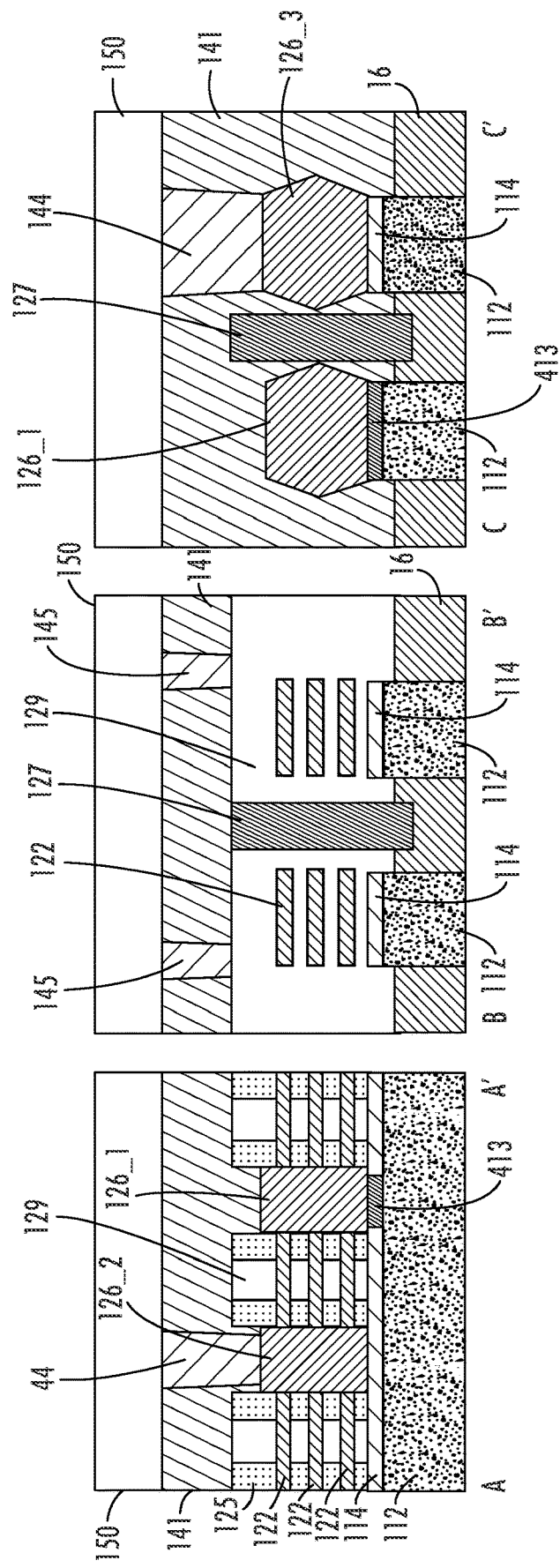

Process(es) (e.g., a grinding process, a wet etching process, a dry etching process and/or a Chemical Mechanical Polishing (CMP) process) may be performed to remove the substrate 110 and the first and second semiconductor regions 18_1 and 18_2. A first backside insulator 112 may be formed on the lower surface 114L of the bottom insulator 114 and the lower surface 413L of the bottom semiconductor layer 413, as illustrated in FIG. 22. The first backside insulator 112 may contact the lower surface 114L of the bottom insulator 114 and the lower surface 413L of the bottom semiconductor layer 413.

Figure 23:
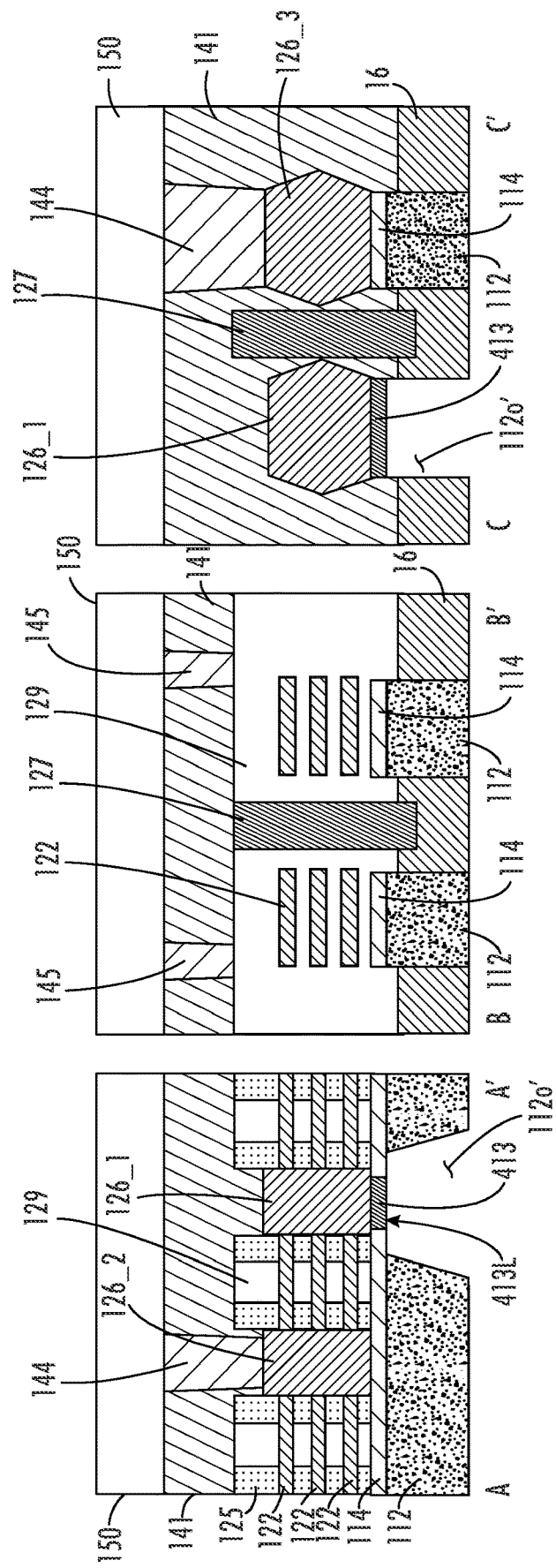
Figure 24:
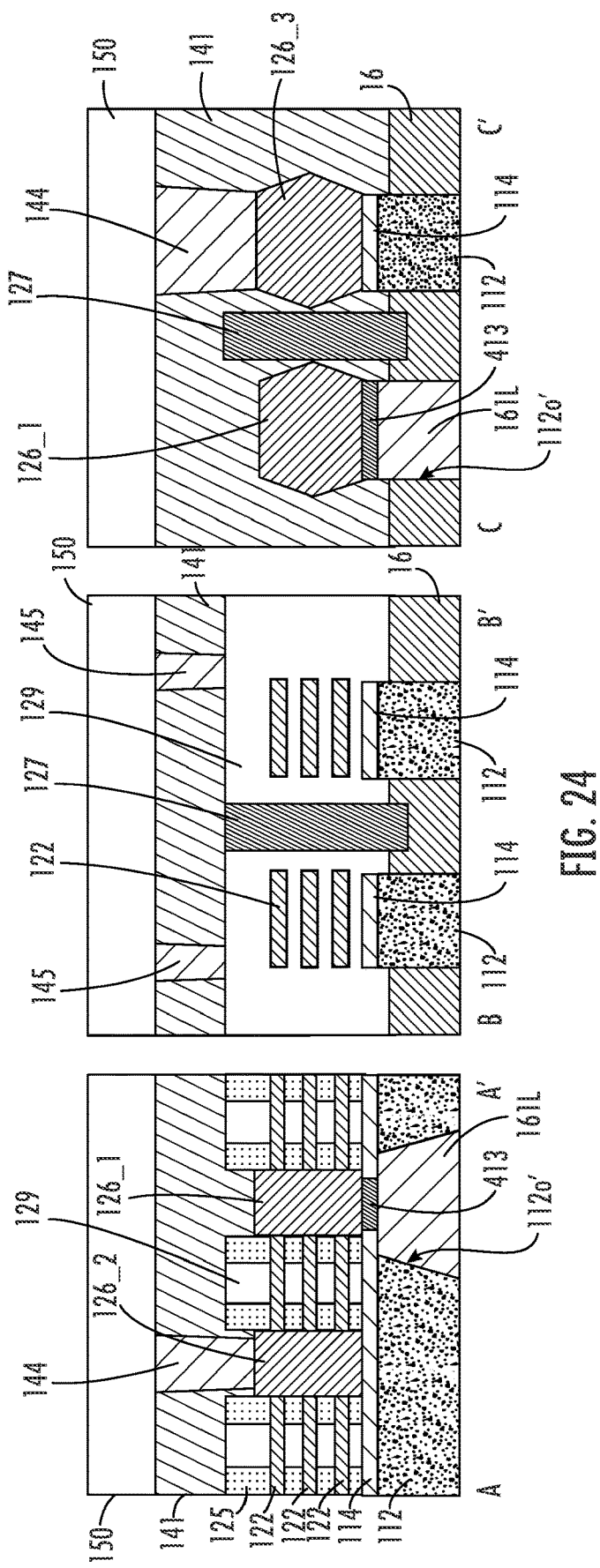

A backside opening 112o' may be formed in the first backside insulator 112, and the backside opening 112o' may expose the lower surface 413L of the bottom semiconductor layer 413, as illustrated in FIG. 23. A lower portion 461L of the power contact structure 162 may be formed in the backside opening 112o', and the lower portion 461L of the power contact structure 162 may contact the lower surface 413L of the bottom semiconductor layer 413, as illustrated in FIG. 24.

Referring to FIGS. 4 and 8, a power rail 172 may be formed on the power contact structure 462 (e.g., a lower surface of the power contact structure 462) (Block S70). The power rail 172 may contact a lower surface of lower portion 461L of the power contact structure 462.

It will be understood that the third integrated circuit device 3000 can be formed by methods similar to those described with reference to FIGS. 9-20 with appropriate modification to those methods. For example, referring to FIG. 14, the third integrated circuit device 3000 may be formed by growing the first source/drain region 126_1 from a side surface of the bottom semiconductor layer 413. Throughout the specification, like elements (e.g., the element 61L in FIG. 3 and the 461L in FIG. 5) have the same last two digits of their reference numbers and have the same name.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing. Although an element is illustrated as a single layer in the drawings, that element may include multiple layers.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:
providing a substrate structure including a substrate, a bottom insulator on the substrate and a semiconductor region between the substrate and the bottom insulator, the semiconductor region extending in a first direction;
forming first and second preliminary transistor structures on the bottom insulator, wherein the first and second preliminary transistor structures are spaced apart from each other in the first direction, and the bottom insulator comprises first and second portions that the first and second preliminary transistor structures respectively overlap, and a third portion between the first and second portions;
replacing the third portion of the bottom insulator with a bottom semiconductor layer;
forming a source/drain region between the first and second preliminary transistor structures and on the bottom semiconductor layer;
replacing the substrate and the semiconductor region with a backside insulator;
forming a power contact in the backside insulator, wherein the source/drain region overlaps the power contact; and
forming a power rail, wherein the power contact is between the source/drain region and the power rail.

2. The method of claim 1, wherein replacing the third portion of the bottom insulator with the bottom semiconductor layer comprises:
forming a bottom opening in the bottom insulator by removing the third portion of the bottom insulator using the first and second preliminary transistor structures as a mask, wherein the bottom opening exposes the semiconductor region; and
forming the bottom semiconductor layer in the bottom opening, wherein the bottom semiconductor layer contacts the semiconductor region.

3. The method of claim 2, wherein forming the bottom semiconductor layer in the bottom opening comprises growing the bottom semiconductor layer using the semiconductor region as a seed layer.

4. The method of claim 2, wherein the first preliminary transistor structure comprises a first side surface facing the second preliminary transistor structure, and the second preliminary transistor structure comprises a second side surface facing the first preliminary transistor structure,
the method further comprises forming first and second gate liners respectively on the first and second side surfaces, and
wherein the third portion of the bottom insulator is removed using the first and second preliminary transistor structures and the first and second gate liners are used as the mask.

5. The method of claim 1, further comprising replacing the bottom semiconductor layer with a portion of the backside insulator,
wherein forming the power contact in the backside insulator comprises:
forming a backside opening that extends through the bottom insulator and the backside insulator and exposes a lower surface of the source/drain region; and
forming the power contact that is in the backside opening and contacts the source/drain region.

6. The method of claim 5, wherein the lower surface of the source/drain region has a first width in the first direction, an interface between the source/drain region and the power contact has a second width in the first direction, and the first width is wider than the second width.

7. The method of claim 1, wherein forming the power contact in the backside insulator comprises:
forming a backside opening that extends through the backside insulator and exposes the bottom semiconductor layer; and
forming the power contact that is in the backside opening and contacts the bottom semiconductor layer, wherein the bottom semiconductor layer contacts a lower surface of the source/drain region.

8. The method of claim 7, wherein the lower surface of the source/drain region has a first width in the first direction, an interface between the source/drain region and the bottom semiconductor layer has a third width in the first direction, and the first width is wider than the third width.

9. The method of claim 1, wherein a width of the power contact in the first direction increases as a distance from the source/drain region increases.

10. The method of claim 1, further comprising, before replacing the substrate and the semiconductor region with the backside insulator, forming a back-end-of-line (BEOL) structure including a conductive wire on the source/drain region.

11. A method of forming an integrated circuit device, the method comprising:
providing a substrate structure including a semiconductor region and a bottom insulator on the semiconductor region;
forming first and second preliminary transistor structures that are on the bottom insulator and are spaced apart from each other in a first direction, the bottom insulator comprising first and second portions that the first and second preliminary transistor structures respectively overlap, and a third portion between the first and second portions;

replacing the third portion of the bottom insulator with a bottom semiconductor layer;

forming a source/drain region between the first and second preliminary transistor structures, wherein a lower surface of the source/drain region contacts the bottom semiconductor layer;

forming a power contact, wherein an upper surface of the power contact faces the lower surface of the source/drain region; and forming a power rail on a lower surface of the power contact.

12. The method of claim 11, wherein replacing the third portion of the bottom insulator with the bottom semiconductor layer comprises:

forming a bottom opening in the bottom insulator by removing the third portion of the bottom insulator using the first and second preliminary transistor structures as a mask, wherein the bottom opening exposes the semiconductor region; and forming the bottom semiconductor layer in the bottom opening, wherein the bottom semiconductor layer contacts the semiconductor region.

13. The method of claim 11, further comprising replacing the bottom semiconductor layer and the semiconductor region with a backside insulator, wherein forming the power contact comprises:

forming a backside opening that extends through the bottom insulator and the backside insulator and exposes the lower surface of the source/drain region; and forming the power contact that is in the backside opening and contacts the source/drain region.

14. The method of claim 11, further comprising replacing the semiconductor region with a backside insulator, wherein forming the power contact comprises:

forming a backside opening that extends through the backside insulator and exposes the bottom semiconductor layer; and forming the power contact that is in the backside opening and contacts the bottom semiconductor layer, wherein the bottom semiconductor layer contacts the lower surface of the source/drain region.

15. The method of claim 11, further comprising, before forming the power contact, forming a back-end-of-line (BEOL) structure including a conductive wire on the source/drain region.

* * * * *